(12) United States Patent
Noh et al.

(10) Patent No.: US 10,978,299 B2
(45) Date of Patent: Apr. 13, 2021

(54) SEMICONDUCTOR DEVICES

(71) Applicant: SAMSUNG ELECTRONICS CO., LTD., Suwon-si (KR)

(72) Inventors: Chang-woo Noh, Hwaseong-si (KR); Myung-gil Kang, Suwon-si (KR); Ho-jun Kim, Suwon-si (KR); Geum-jong Bae, Suwon-si (KR); Dong-il Bae, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/361,914

(22) Filed: Mar. 22, 2019

(65) Prior Publication Data
US 2020/0075331 A1 Mar. 5, 2020

(30) Foreign Application Priority Data
Aug. 30, 2018 (KR) ........................ 10-2018-0103027

(51) Int. Cl.
| | |
|---|---|
| H01L 21/02 | (2006.01) |
| H01L 21/762 | (2006.01) |
| H01L 21/768 | (2006.01) |
| H01L 29/165 | (2006.01) |
| H01L 29/78 | (2006.01) |
| H01L 29/06 | (2006.01) |
| H01L 29/423 | (2006.01) |

(52) U.S. Cl.
CPC .. H01L 21/02603 (2013.01); H01L 21/76224 (2013.01); H01L 21/76802 (2013.01); H01L 29/0673 (2013.01); H01L 29/165 (2013.01); H01L 29/42356 (2013.01); H01L 29/7848 (2013.01)

(58) Field of Classification Search
CPC ......... H01L 29/42356; H01L 29/42392; H01L 29/0673; H01L 29/0669
See application file for complete search history.

(56) References Cited

U.S. PATENT DOCUMENTS

| | | | |
|---|---|---|---|
| 7,427,788 B2 | 9/2008 | Li et al. | |
| 7,781,290 B2 | 8/2010 | Lee et al. | |
| 8,785,981 B1* | 7/2014 | Chang | H01L 29/42392 257/213 |
| 9,299,700 B2* | 3/2016 | Park | H01L 29/0847 |

(Continued)

FOREIGN PATENT DOCUMENTS

| | | |
|---|---|---|
| KR | 10-0604908 B1 | 7/2006 |
| KR | 10-0652381 B1 | 12/2006 |

*Primary Examiner* — Victoria K. Hall
(74) *Attorney, Agent, or Firm* — Lee IP Law, PC

(57) ABSTRACT

A semiconductor device according to an example embodiment includes a substrate extending in first and second directions intersecting with each other; nanowires on the substrate and spaced apart from each other in the second direction; gate electrodes extending in the first direction and spaced apart from each other in the second direction, and surrounding the nanowires to be superimposed vertically with the nanowires; external spacers on the substrate and covering sidewalls of the gate electrodes on the nanowires; and an isolation layer between the gate electrodes and extending in the first direction, wherein an upper surface of the isolation layer is flush with upper surfaces of the gate electrodes.

20 Claims, 27 Drawing Sheets

(56) References Cited

U.S. PATENT DOCUMENTS

| | | | |
|---|---|---|---|
| 9,356,027 B1* | 5/2016 | Cheng | H01L 27/0924 |
| 9,362,181 B1* | 6/2016 | Xie | H01L 21/823878 |
| 9,412,616 B1* | 8/2016 | Xie | H01L 21/76224 |
| 9,425,287 B2* | 8/2016 | Cheng | H01L 21/02532 |
| 9,460,957 B2* | 10/2016 | Lee | H01L 21/76237 |
| 9,564,369 B1* | 2/2017 | Kim | H01L 21/823431 |
| 9,614,035 B2* | 4/2017 | Kim | H01L 29/0653 |
| 9,620,628 B1* | 4/2017 | Huang | H01L 29/66795 |
| 9,653,583 B1* | 5/2017 | Zhao | H01L 29/66795 |
| 9,685,539 B1 | 6/2017 | Cheng et al. | |
| 9,704,864 B2* | 7/2017 | Park | H01L 27/0886 |
| 9,780,166 B2* | 10/2017 | Leobandung | H01L 29/0673 |
| 9,881,998 B1* | 1/2018 | Cheng | H01L 29/0649 |
| 9,905,468 B2* | 2/2018 | Kim | H01L 21/823481 |
| 9,917,152 B1 | 3/2018 | Cheng et al. | |
| 9,929,160 B1* | 3/2018 | Lee | H01L 27/0924 |
| 9,947,672 B2* | 4/2018 | Park | H01L 21/823431 |
| 9,953,977 B1* | 4/2018 | Cheng | H01L 29/6653 |
| 9,978,835 B2* | 5/2018 | Yang | H01L 29/068 |
| 9,997,519 B1* | 6/2018 | Bao | H01L 27/092 |
| 10,014,208 B2* | 7/2018 | Kim | H01L 27/0886 |
| 10,121,870 B1* | 11/2018 | Chiang | 257/4238 |
| 10,121,875 B1* | 11/2018 | Ho | H01L 21/76801 |
| 10,128,246 B2* | 11/2018 | Park | H01L 27/0886 |
| 10,141,312 B2* | 11/2018 | Jeon | H01L 27/0924 |
| 10,141,403 B1* | 11/2018 | Cheng | H01L 29/0603 |
| 10,153,277 B2* | 12/2018 | Tak | H01L 29/0847 |
| 10,170,484 B1* | 1/2019 | Sung | H01L 29/1033 |
| 10,243,040 B1* | 3/2019 | Park | H01L 29/42392 |
| 10,256,158 B1* | 4/2019 | Frougier | H01L 29/42356 |
| 10,453,752 B2* | 10/2019 | Van Dal | H01L 29/78618 |
| 10,490,559 B1* | 11/2019 | Ando | H01L 29/775 |
| 10,559,566 B1* | 2/2020 | Lee | H01L 29/775 |
| 10,566,326 B2* | 2/2020 | Kwak | H01L 29/66795 |
| 10,622,479 B1* | 4/2020 | Yang | H01L 29/66545 |
| 10,636,796 B2* | 4/2020 | Takesako | H01L 29/785 |
| 10,636,886 B2* | 4/2020 | Jo | H01L 21/823431 |
| 10,643,898 B2* | 5/2020 | Kim | H01L 21/823481 |
| 10,643,899 B2* | 5/2020 | Zhang | H01L 27/0886 |
| 10,644,156 B2* | 5/2020 | Gao | H01L 29/785 |
| 10,665,669 B1* | 5/2020 | Xie | H01L 21/823431 |
| 2002/0160550 A1* | 10/2002 | Jang | H01L 28/91 438/60 |
| 2003/0075730 A1* | 4/2003 | Jang | H01L 29/785 257/200 |
| 2004/0063286 A1* | 4/2004 | Kim | H01L 29/66636 438/283 |
| 2005/0266645 A1* | 12/2005 | Park | H01L 29/66636 438/282 |
| 2005/0272231 A1* | 12/2005 | Yun | H01L 29/66545 438/585 |
| 2006/0125018 A1 | 6/2006 | Lee et al. | |
| 2007/0196973 A1* | 8/2007 | Park | H01L 29/42384 438/197 |
| 2014/0217502 A1* | 8/2014 | Chang | H01L 29/861 257/347 |
| 2014/0273360 A1* | 9/2014 | Cheng | H01L 29/66439 438/157 |
| 2014/0315363 A1* | 10/2014 | Balakrishnan | H01L 27/1108 438/233 |
| 2015/0090958 A1* | 4/2015 | Yang | H01L 29/0676 257/27 |
| 2015/0145042 A1* | 5/2015 | Bu | H01L 29/66439 257/347 |
| 2015/0325575 A1* | 11/2015 | Park | H01L 29/0653 257/401 |
| 2016/0020150 A1* | 1/2016 | You | H01L 29/165 438/218 |
| 2016/0043170 A1* | 2/2016 | Park | H01L 27/0886 257/369 |
| 2016/0276449 A1* | 9/2016 | Bae | B82Y 10/00 |
| 2016/0336234 A1* | 11/2016 | Kim | H01L 21/823481 |
| 2016/0351411 A1* | 12/2016 | Xie | H01L 21/3086 |
| 2016/0358913 A1* | 12/2016 | Kim | H01L 29/0649 |
| 2016/0380052 A1* | 12/2016 | Kim | H01L 27/1211 257/401 |
| 2017/0047402 A1* | 2/2017 | Yang | H01L 29/42392 |
| 2017/0110456 A1* | 4/2017 | Jeon | H01L 29/0653 |
| 2017/0110554 A1* | 4/2017 | Tak | H01L 29/42392 |
| 2017/0148797 A1* | 5/2017 | Kim | H01L 27/1104 |
| 2017/0221893 A1* | 8/2017 | Tak | H01L 29/0665 |
| 2017/0271336 A1* | 9/2017 | Park | H01L 29/7848 |
| 2017/0309625 A1* | 10/2017 | Kim | H01L 21/823437 |
| 2017/0365604 A1* | 12/2017 | Suh | H01L 21/823807 |
| 2018/0033870 A1* | 2/2018 | Huang | H01L 29/66795 |
| 2018/0083007 A1* | 3/2018 | Lee | H01L 27/092 |
| 2018/0090493 A1* | 3/2018 | Kwak | H01L 21/823431 |
| 2018/0261668 A1* | 9/2018 | Yang | H01L 29/0847 |
| 2018/0286956 A1* | 10/2018 | Xie | H01L 29/42376 |
| 2018/0366329 A1* | 12/2018 | Kim | H01L 29/66545 |
| 2019/0027604 A1* | 1/2019 | Lee | H01L 29/66545 |
| 2019/0131396 A1* | 5/2019 | Zhang | H01L 29/66553 |
| 2019/0165145 A1* | 5/2019 | Ghani | H01L 29/7851 |
| 2019/0198400 A1* | 6/2019 | Miao | H01L 29/7827 |
| 2019/0296145 A1* | 9/2019 | Huang | H01L 29/1054 |
| 2019/0341450 A1* | 11/2019 | Lee | H01L 21/823431 |
| 2020/0035705 A1* | 1/2020 | Kim | H01L 27/088 |
| 2020/0051981 A1* | 2/2020 | Yang | H01L 27/092 |
| 2020/0083219 A1* | 3/2020 | Kang | H01L 27/088 |
| 2020/0098915 A1* | 3/2020 | Cheng | H01L 21/3085 |
| 2020/0161190 A1* | 5/2020 | Zang | H01L 21/76224 |
| 2020/0168607 A1* | 5/2020 | Yang | H01L 27/0924 |

\* cited by examiner

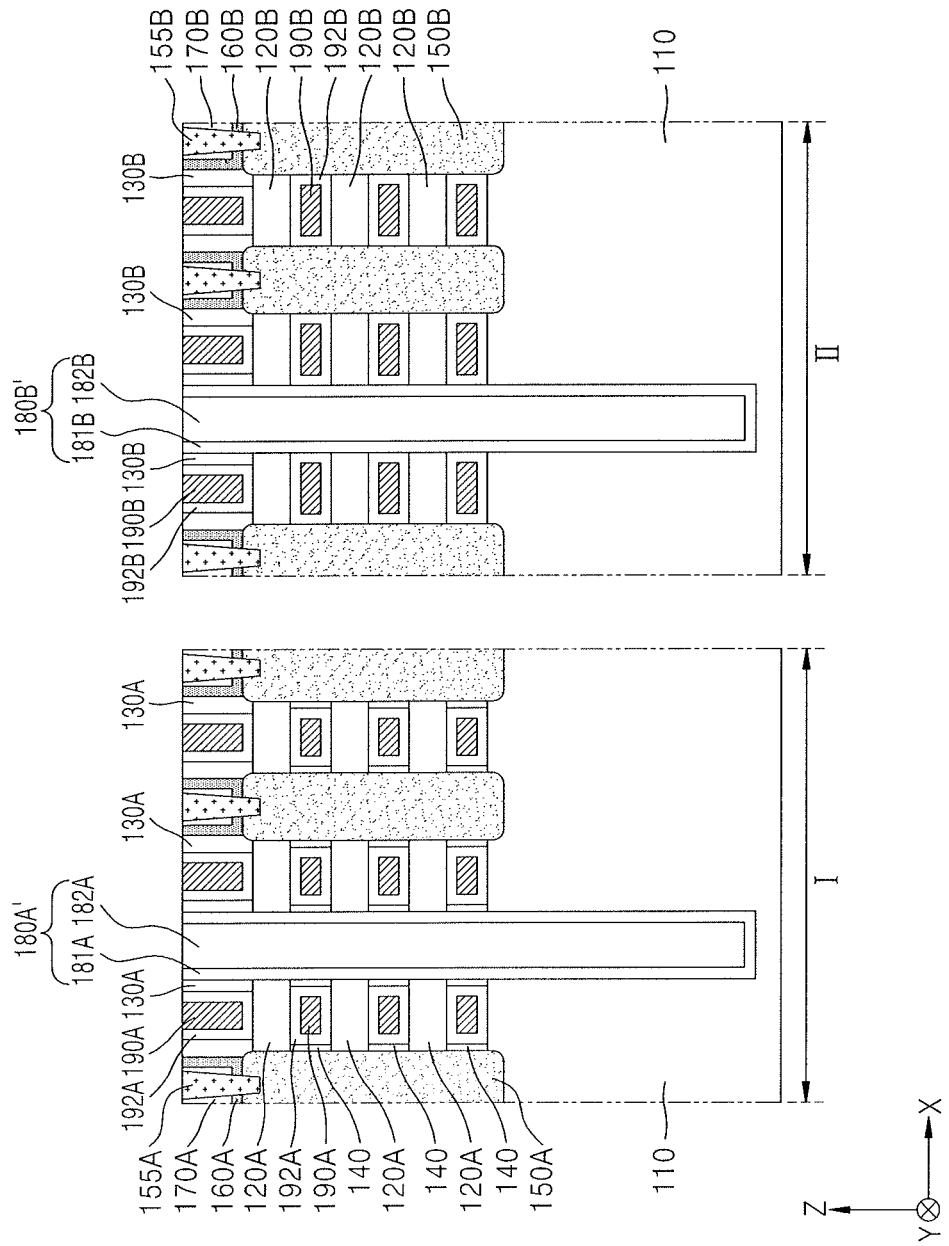

SEMICONDUCTOR DEVICES

CROSS-REFERENCE TO RELATED APPLICATION

Korean Patent Application No. 10-2018-0103027, filed on Aug. 30, 2018, in the Korean Intellectual Property Office, and entitled: "Semiconductor Devices," is incorporated by reference herein in its entirety.

BACKGROUND

1. Field

Embodiments relate to semiconductor devices and methods of manufacturing the same.

2. Description of the Related Art

There has been an increasing demand for high integration of semiconductor devices in accordance with the tendency of electronic devices to be small and light.

SUMMARY

Embodiments are directed to a semiconductor device including a substrate extending in first and second directions intersecting with each other, nanowires on the substrate and spaced apart from each other in the second direction, gate electrodes extending in the first direction and spaced apart from each other in the second direction, and surrounding the nanowires to be superimposed vertically with the nanowires, external spacers on the substrate and covering sidewalls of the gate electrodes on the nanowires, and an isolation layer between the gate electrodes and extending in the first direction. An upper surface of the isolation layer may be flush with upper surfaces of the gate electrodes.

Embodiments are also directed to a semiconductor device including a substrate extending in first and second directions intersecting with each other, nanowires on the substrate and spaced apart from each other in the second direction, gate electrodes extending in the first direction and spaced apart from each other in the second direction, and surrounding the nanowires to be superimposed vertically with the nanowires, external spacers on the substrate and covering sidewalls of the gate electrodes on the nanowires, and an isolation layer between the gate electrodes and extending in the first direction. The isolation layer may include a plurality of layers.

Embodiments are also directed to a semiconductor device including a substrate including a first region and a second region that are horizontally spaced from each other, first nanowires in the first region and horizontally spaced from each other, first gate electrodes in the first region and surrounding the first nanowires, first gate dielectric layers in the first region and between the first nanowires and the first gate electrodes, first external spacers in contact with the first gate dielectric layers on the first nanowires, and a first isolation layer between the first gate electrodes, second nanowires in the second region and horizontally spaced from each other, second gate electrodes in the second region and surrounding the second nanowires, second gate dielectric layers in the second region and between the second nanowires and the second gate electrodes, and second external spacers in contact with the second gate dielectric layers on the second nanowires, and a second isolation layer between the second gate electrodes. The first isolation layer may be arranged at the same level as upper surfaces of the first gate electrodes, and the second isolation layer may be arranged at the same level as upper surfaces of the second gate electrodes.

BRIEF DESCRIPTION OF THE DRAWINGS

Features will become apparent to those of skill in the art by describing in detail example embodiments with reference to the attached drawings in which:

FIGS. 2 to 4 illustrate cross-sectional views of semiconductor devices according to an example embodiment.

DETAILED DESCRIPTION

Figure 1A:
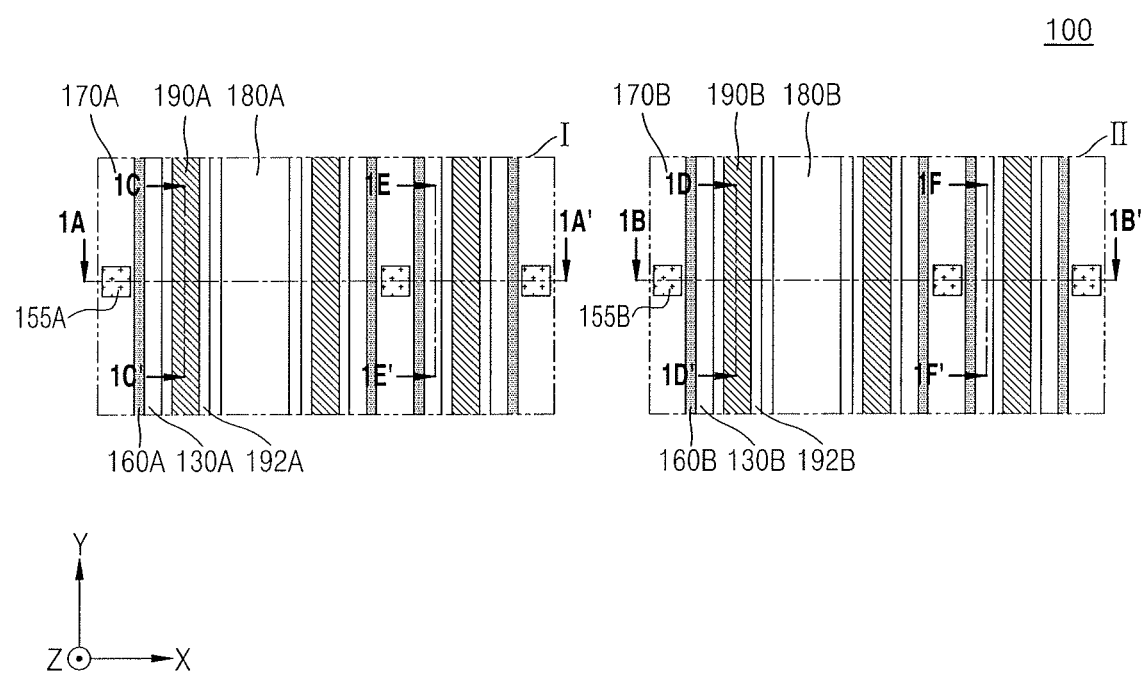
FIG. 1A illustrates a plan view for explaining a semiconductor device according to an example embodiment.
Figure 1B:
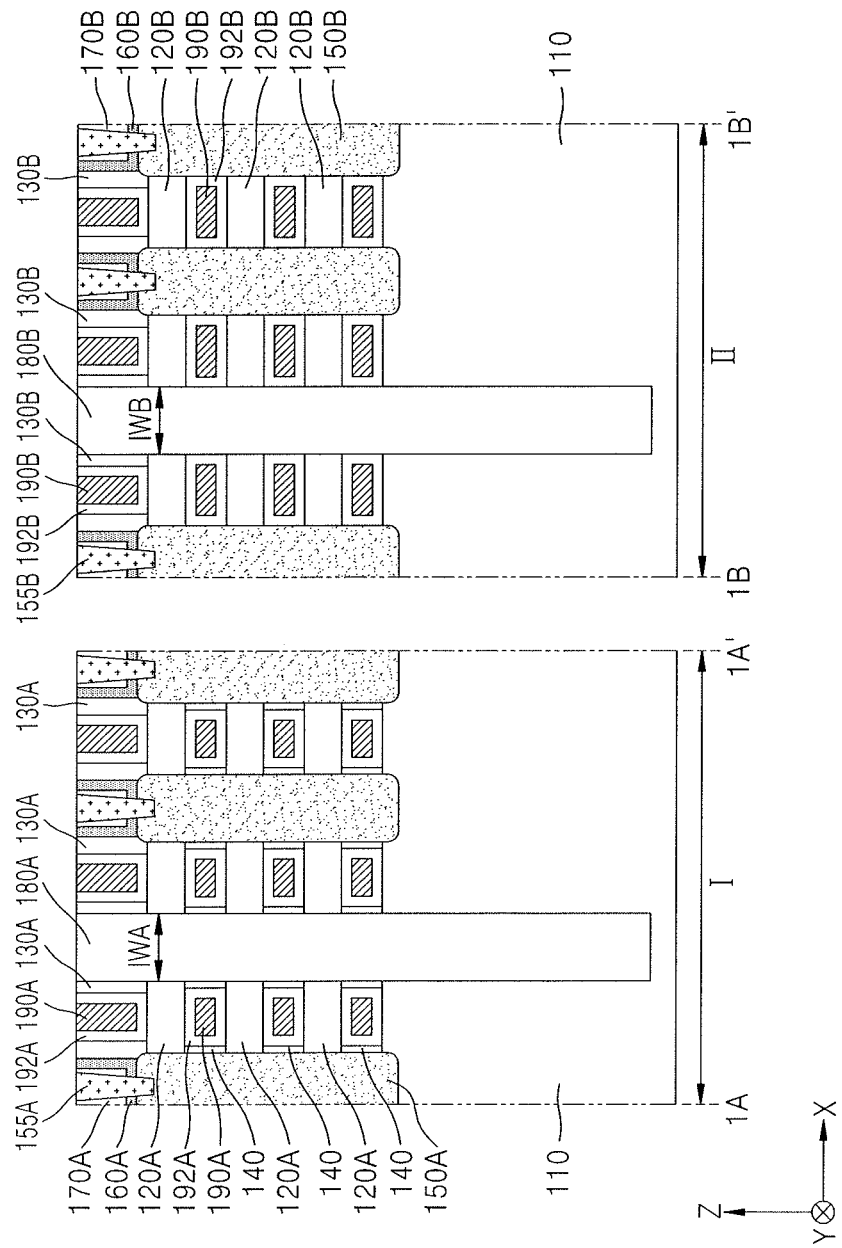
FIG. 1B illustrates a cross-sectional view taken along lines 1A-1A' and 1B-1B' of FIG. 1A.
Figure 1C:
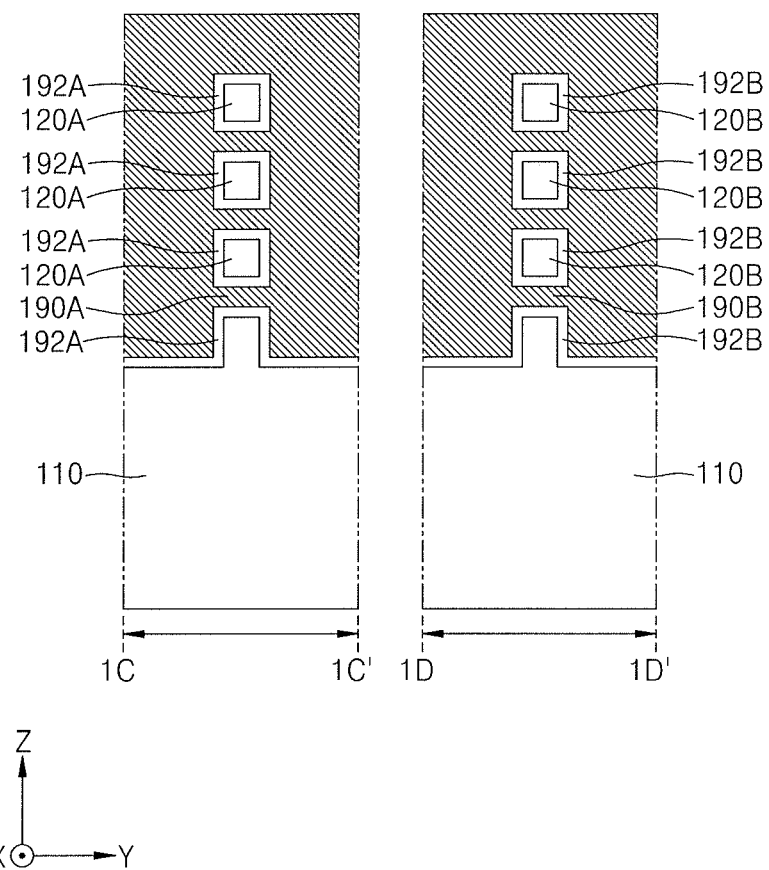
FIG. 1C illustrates a cross-sectional view taken along lines 1C-1C' and 1D-1D' of FIG. 1A.
Figure 1D:
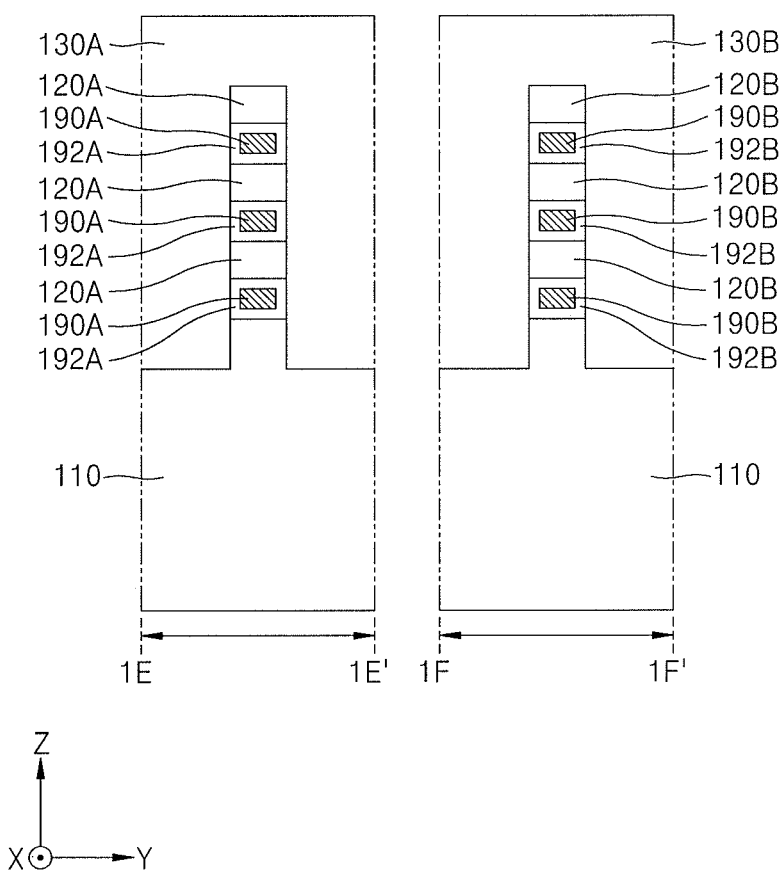
FIG. 1D illustrates a cross-sectional view taken along lines 1E-1E' and 1F-1F' of FIG. 1A.

FIG. 1A is a plan view of a semiconductor device according to an example embodiment. FIG. 1B is a cross-sectional view taken along lines 1A-1A' and 1B-1B' of FIG. 1A. FIG. 1C is a cross-sectional view taken along lines 1C-1C' and 1D-1D' of FIG. 1A. FIG. 1D is a cross-sectional view taken along lines 1E-1E' and 1F-1F' of FIG. 1A.

In FIGS. 1A to 1D, two directions parallel to an upper surface of a substrate 110 and intersecting with each other are defined as a first direction (X direction) and a second direction (Y direction), respectively, and a direction substantially perpendicular to the upper surface is defined as a third direction (Z direction). The first direction (X direction) and the second direction (Y direction) may be substantially perpendicular to each other. The first direction (X direction) and the second direction (Y direction) are directions substantially perpendicular to the third direction (Z direction). A direction indicated by the arrow in the drawings and a direction opposite thereto are described as an identical direction. Definitions of the above-described directions are the same in all subsequent drawings.

Referring to FIGS. 1A to 1D, a first region I and a second region II may be defined on the substrate 110 of the semiconductor device 100. The first region I and the second region II may be regions in which different types of semiconductor devices are arranged. For example, an NMOS transistor may be arranged in the first region I, and a PMOS transistor may be arranged in the second region II.

According to an example embodiment, the substrate 110 may include a silicon substrate. According to an example embodiment, the substrate 110 may be a substrate for implementing a device such as image sensor such as system large scale integration (LSI), a logic circuit, a CMOS imaging sensor (CIS), a memory device such as a flash memory, dynamic random access memory (DRAM), static RAM (SRAM), electrically programmable read only memory (EPROM), electrically erasable programmable ROM (EEPROM), or a micro-electro-mechanical system (MEMS).

According to an example embodiment, at least one of first nanowires 120A, first external spacers 130A, an internal spacer 140, first source/drain regions 150A, first source/drain contacts 155A, a first etch stop pattern 160A, a first insulating layer 170A, a first isolation layer 180A, a first gate electrode 190A, and a first gate dielectric layer 192A may be arranged in the first region I.

According to an example embodiment, the first nanowires 120A may include a Group IV semiconductor, a Group IV-IV compound semiconductor, or a Group III-V compound semiconductor. For example, the first nanowires 120A may include silicon (Si), germanium (Ge), SiGe, indium gallium arsenide (InGaAs), GaSb, InSb, or combinations thereof.

The first gate electrode 190A may include, for example, doped polysilicon, metal, or a combination thereof. According to an example embodiment, the first gate electrode 190A may include, for example, aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminum (TiAl), TiAlN, tantalum carbide nitride (TaCN), TaC, TaSiN, or a combination thereof.

According to an example embodiment, the first gate dielectric layer 192A may include, for example, a silicon oxide film, a silicon oxynitride film, a high-k dielectric film having a dielectric constant higher than that of the silicon oxide film, or a combination thereof. According to an example embodiment, the high-k dielectric film that may be used as the first gate dielectric layer 192A may include, for example, any one of a hafnium oxide ($HfO_2$), a hafnium silicate (HfSiO), a hafnium silicon oxynitride (HfSiON), a hafnium tantalum oxide (HfTaO), a hafnium titanium oxide (HfTiO), a hafnium zirconium oxide (HfZrO), a zirconium oxide, an aluminum oxide, or a $HfO_2$-aluminum oxide ($Al_2O_3$) alloy.

The first source/drain regions 150A extending to both ends of the first nanowires 120A may be formed on the substrate 110 in the direction (Z direction) perpendicular to an upper surface of the substrate 110. According to an example embodiment, a first source/drain region 150A may include, for example, a doped SiGe film, a doped Ge film, a doped silicon carbide (SiC) film, or a doped InGaAs film. The first source/drain region 150A may include a semiconductor layer formed from the substrate 110 and the first nanowires 120A by an epitaxy process. According to an example embodiment, the first source/drain region 150A may include a material different from those of the substrate 110 and the first nanowires 120A.

According to an example embodiment, an upper surface of the first source/drain region 150A may be higher than upper surfaces of the first nanowires 120A. According to an example embodiment, a portion of the first source/drain region 150A may serve as a source/drain region of a transistor formed in the first region I. According to an example embodiment, impurity ions may be heavily doped in a portion from a bottom surface of the first source/drain region 150A to a certain height. According to another example embodiment, impurity ions may be heavily doped to a certain height from a central portion of the first source/drain region 150A. According to another example embodiment, impurity ions may be heavily doped into the entire first source/drain region 150A.

The first external spacers 130A may cover a sidewall of the first gate electrode 190A. The first source/drain contacts 155A may be connected to the first source/drain region 150A through the first insulating layer 170A and the first etch stop pattern 160A. A metal silicide layer may be formed between the first source/drain contacts 155A and the first source/drain region 150A.

The first etch stop pattern 160A may be arranged on the first source/drain region 150A and the first external spacers 130A. The first etch stop pattern 160A may cover a portion of the first source/drain region 150A and sides of the first external spacers 130A. The first etch stop pattern 160A may include a material having a high etch selectivity to the first insulating layer 170A. According to an example embodiment, the first etch stop pattern 160A may include, for example, a silicon nitride.

A portion of the first gate electrode 190A may be between the adjacent first nanowires 120A or between the first nanowires 120A closest to the substrate 110 and the substrate 110. The portion of the first gate electrode 190A between the adjacent first nanowires 120A or between the first nanowires 120A closest to the substrate 110 and the substrate 110 may be covered by the first gate dielectric layer 192A. The first gate dielectric layer 192A may be between the first gate electrode 190A and the internal spacer 140 and between the first gate electrode 190A and the first nanowires 120A. The first gate dielectric layer 192A may extend on the surface of the first nanowires 120A and a sidewall surface of the internal spacer 140.

The internal spacer 140 may be between the adjacent first nanowires 120A and/or between the substrate 110 and the first nanowires 120A adjacent to the substrate 110. The internal spacer 140 may be in contact with the first source/drain region 150A and the first gate dielectric layer 192A. The internal spacers 140 may be between the first source/drain region 150A and the first gate dielectric layer 192A. Thus, the first source/drain region 150A may be apart from the first gate dielectric layer 192A.

The internal spacer 140 may include a material different from a material included in the first gate dielectric layer 192A. According to an example embodiment, the material included in the internal spacer 140 may have a smaller dielectric constant than the material included in the first gate dielectric layer 192A. According to an example embodiment, the internal spacer 140 may include an oxide of a Group IV semiconductor, an oxide of a Group IV-V compound semiconductor, an oxide of a Group III-V compound semiconductor, an oxide such as a silicon oxide, a silicon oxynitride, silicon nitride, or a combination thereof.

According to an example embodiment, the first external spacers 130A and the internal spacer 140 may be arranged at different levels on the substrate 110 in the third direction (Z direction). According to an example embodiment, the first external spacers 130A and the internal spacer 140 may overlap each other in the third direction (Z direction). According to an example embodiment, the internal spacer 140 may include a material different from a material included in the first external spacers 130A. According to an example embodiment, the material included in the internal spacer 140 may have a smaller dielectric constant than the material included in the first external spacers 130A.

According to an example embodiment, the first isolation layer 180A may include an insulating material (e.g., a silicon oxide). According to an example embodiment, the first isolation layer 180A may extend in the second direction (Y direction). According to an example embodiment, the first isolation layer 180A may extend in the third direction (Z direction). According to an example embodiment, an upper surface of the first isolation layer 180A may be higher than the upper surface of the first source/drain region 150A, and a lower surface of the first isolation layer 180A may be lower than a lower surface of the first source/drain region 150A. According to an example embodiment, a length of the first isolation layer 180A in the third direction (Z direction) may be greater than a length of the first source/drain region 150A in the third direction (Z direction). According to an example embodiment, the first isolation layer 180A may be between the first external spacers 130A. According to an example embodiment, a width (i.e., a length in the first direction (X direction)) of a first external spacer 130A in contact with the first isolation layer 180A is less than a width (i.e., a length in the first direction (X direction)) of a first external spacer 130A not in contact with the first isolation layer 180A.

According to an example embodiment, the upper surface of the first isolation layer 180A may be substantially flush with an upper surface of the first insulation layer 170A. According to an example embodiment, the upper surface of the first isolation layer 180A may be substantially flush with an upper surface of the first etch stop pattern 160A.

According to an example embodiment, the first isolation layer 180A may be in contact with the internal spacer 140. According to an example embodiment, a side surface of the first isolation layer 180A may be substantially flush with the sidewall surface of the internal spacer 140.

At least one of second nanowires 120B, second external spacers 130B, second source/drain regions 150B, second source/drain contacts 155B, a second etch stop pattern 160B, a second insulating layer 170B, a second isolation layer 180B, a second gate electrode 190B, and a second gate dielectric layer 192B may be arranged in the second region II.

The second gate electrode 190B and the second gate dielectric layer 192B may have features similar to those described above for the first gate electrode 190A and the first gate dielectric layer 192A. For example, the second gate electrode 190B may include doped polysilicon, a metal, or a combination thereof, and the second gate dielectric layer 192B may include a silicon oxide film, a silicon oxynitride film, a high-k dielectric film having a dielectric constant higher than that of the silicon oxide film, or a combination thereof.

According to an example embodiment, the second gate electrode 190B and the second gate dielectric layer 192B may include, for example, the same materials as those of the first gate electrode 190A and the first gate dielectric layer 192A respectively. For example, the second gate electrode 190B and the second gate dielectric layer 192B may include different materials from those of the first gate electrode 190A and the first gate dielectric layer 192A, respectively.

A second source/drain region 150B may be formed extending in the third direction (Z direction) adjacent to both ends of the second nanowires 120B on the substrate 110. The second source/drain region 150B may include a semiconductor layer regrown from the substrate 110 and the second nanowires 120B by an epitaxy process. According to an example embodiment, the second source/drain region 150B may include a material different from those of the second nanowires 120B. According to an example embodiment, the second source/drain region 150B may include, for example, a doped SiGe film, a doped Ge film, a doped SiC film, or a doped InGaAs film.

According to an example embodiment, the second source/drain region 150B may include a material different from that of the first source/drain region 150A. The first source/drain region 150A may include SiC, and the second source/drain region 150B may include SiGe or Ge.

A second external spacer 130B, the second etch stop pattern 160B, the second insulating layer 170B, the second source/drain contacts 155B may have features similar to those described above for the first external spacers 130A, the first insulating layer 170A, and the first source/drain contacts 155A. According to an example embodiment, the second external spacer 130B, the second insulating layer 170B, and the second source/drain contacts 155B may be formed in the same process as the process for forming the first external spacers 130A, the first insulating layer 170A, and the first source/drain contacts 155A, respectively. In other embodiments, the second external spacer 130B may be formed in a process different from the process for forming the first insulating layer 170A. According to an example embodiment, the second insulating layer 170B may be formed in a process different from the process for forming the first insulating layer 170A.

As compared to the first region I, the internal spacers 140 may not be arranged on the second region II. Accordingly, the internal spacers 140 may not be between the substrate 110 and the second nanowires 120B. According to an example embodiment, as shown in FIG. 1B, the second gate dielectric layer 192B may be between the second gate electrode 190B and the second source/drain region 150B. Thus, the second gate dielectric layer 192B may extend from between the substrate 110 and the second nanowires 120B to between the second gate electrode 190B and the second source/drain region 150B. The second source/drain region 150B may be in contact with the second gate dielectric layer 192B.

According to an example embodiment, as shown in FIG. 1B, the internal spacer 140 may be formed between the first gate electrode 190A and the first source/drain region 150A, but not between the second gate electrode 190B and the second source/drain region 150B.

As the internal spacer 140 is formed between the first gate electrode 190A and the first source/drain region 150A, a distance between the first gate electrode 190A and the first source/drain region 150A may increase. Thus, a parasitic capacitance between the first source/drain regions 150A may be reduced. Omitting the internal spacer 140 (from between the second gate electrode 190B and the second source/drain region 150B) may improve the crystal quality of the second source/drain region 150B.

According to an example embodiment, the second isolation layer 180B may be formed to have features and shapes similar to those of the first isolation layer 180A. In another implementation, the second isolation layer 180B may include a material different from that of the first isolation layer 180A. Accordingly, stress applied to a device formed in the second region II by the second isolation layer 180B and stress applied to a device formed in the first region I by the first isolation layer 180A may be changed. Therefore, the mobility of carrier charges of materials included in the first and second isolation layers 180A and 180B may be improved.

According to an example embodiment, a first isolation layer 180A may have a first width IWA and the second isolation layer 180B may have a second width IWB. According to an example embodiment, the first width IWA and the second width IWB may be the same. In another implementation, the first width IWA and the second width IWB may be different from each other. Thus, the width of the first external spacer 130A in contact with the first isolation layer 180A may be different from a width of the second external spacer 130B in contact with the second isolation layer 180B.

According to an example embodiment, as described below, the first and second isolation layers 180A and 180B may be formed after the first and second source/drain regions 150A and 150B are formed. Therefore, in the process for forming the first and second source/drain regions 150A and 150B, it may be possible to reduce or prevent a portion of the first and second isolation layers 180A and 180B from being damaged and reduce or prevent unintended epitaxial growth from occurring in such a damaged portion.

The first and second isolation layers 180A and 180B may be formed at positions aligned by first and second capping layers 266A and 266B (see FIG. 13B) and the first and second external spacers 130A and 130B. Thus, damage to the first and second nanowires 120A and 120B adjacent to the first and second isolation layers 180A and 180B may be prevented, which may reduce or prevent a short circuit between the first and second source/drain regions 150A and 150B and the first and second gate electrodes 190A and 190B.

Figure 3:
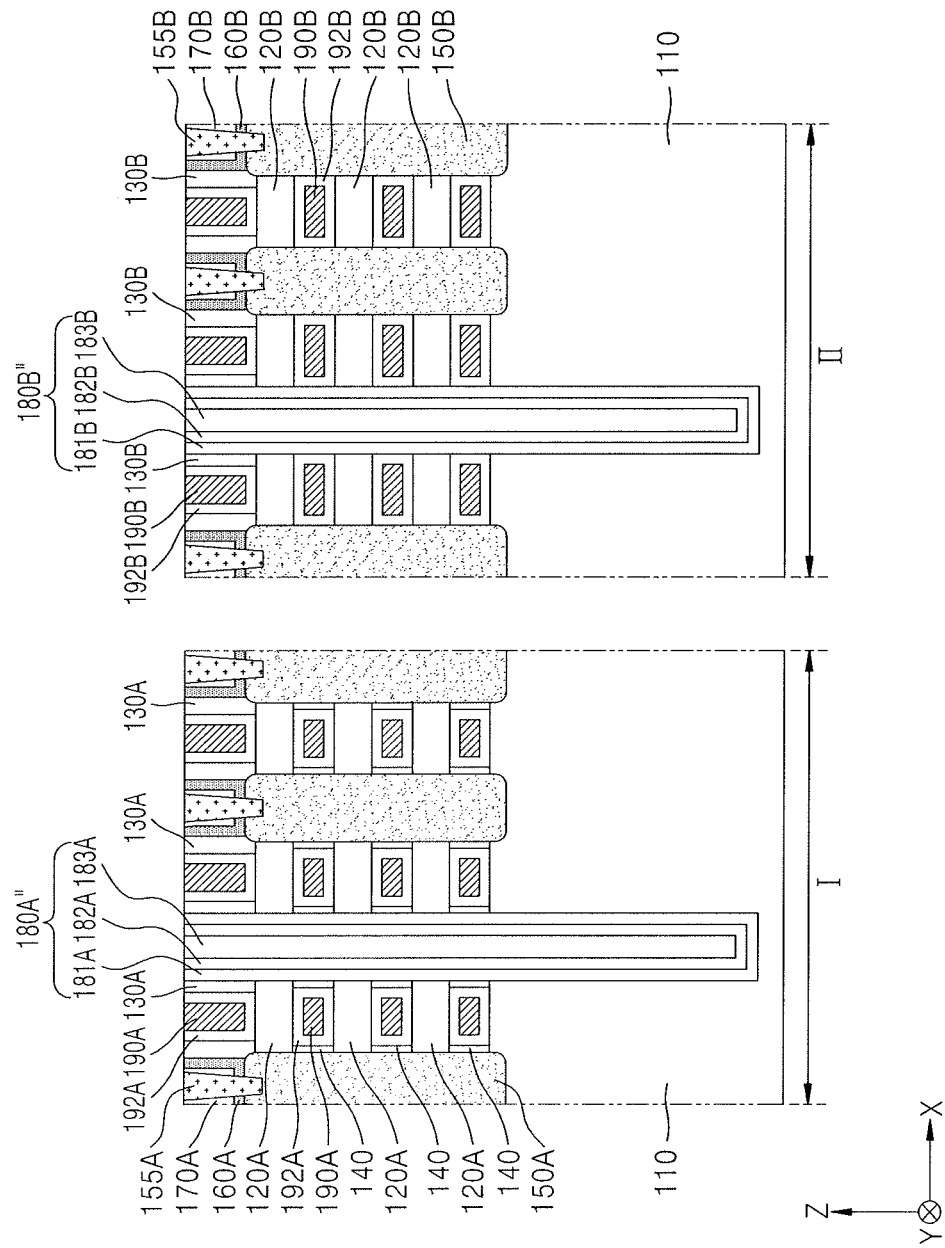
Figure 4:
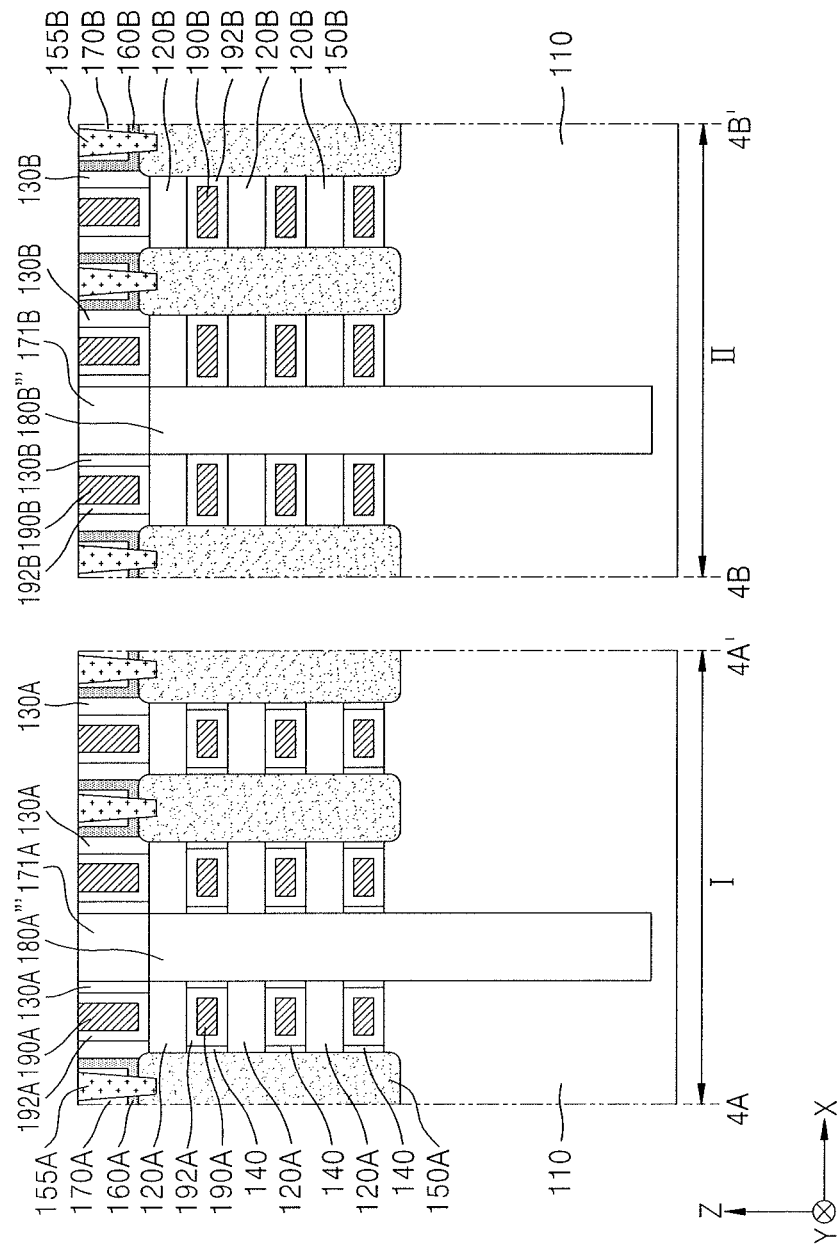

FIGS. 2 to 4 are cross-sectional views corresponding to lines 1A-1A' and 1B-1B' in FIG. 1. For convenience of description, the same reference numerals like in FIGS. 1A to 1D denote the same elements, and therefore, only differences will be mainly described.

Referring to FIG. 2, first and second isolation layers 180A' and 180B' may include first and second liners 181A and 181B and first and second fillers 182A and 182B, respectively. According to an example embodiment, the first and second liners 181A and 181E may be conformally formed to have a U-shaped cross-section, as shown in FIG. 2. The first and second fillers 182A and 182B may respectively fill inner spaces defined by the first and second liners 181A and 181B. Accordingly, the first and second liners 181A and 181B may cover side and bottom surfaces of the first and second fillers 182A and 182B, respectively. The first liner 181A may be in contact with the first external spacer 130A, the first nanowires 120A, and the internal spacer 140. The second liner 181B may be in contact with the second external spacer 130B, the second nanowires 120B, and the second gate dielectric layer 192B, respectively. Upper surfaces of the first and second liners 181A and 181B may be substantially flush with upper surfaces of the first and second fillers 182A and 182B, respectively.

The first and second fillers 182A and 182B may have the same composition as the first and second isolation layers 180A and 180B described with reference to FIGS. 1A to 1D, respectively. The first and second liners 181A and 181B may have different compositions than the first and second fillers 182A and 182B.

Referring to FIG. 3, first and second isolation layers 180A'' and 180B'' may include the first and second liners 181A and 181B, the first and second fillers 182A and 182B, and first and second stress control layers 183A and 183B, respectively. According to an example embodiment, the first and second liners 181A and 181B may be substantially the same as the first and second liners 181A and 181B described with reference to FIG. 2, respectively. According to an example embodiment, the first and second fillers 182A and 182B may partially fill inner spaces defined by the first and second liners 181A and 181B, respectively. According to an example embodiment, the first and second fillers 182A and 182B may be conformally formed to have a U-shaped cross-section. According to an example embodiment, the first and second stress control layers 183A and 183B may fill inner spaces defined by the first and second fillers 182A and 182B, respectively.

According to an example embodiment, the first and second stress control layers 183A and 183E may apply different stresses to semiconductor devices formed in the first and second regions I and II, respectively. In another implementation, the first and second stress control layers 183A and 183B may apply substantially the same stress to the semiconductor devices formed in the first and second regions I and II, respectively.

According to an example embodiment, the first and second stress control layers 183A and 183B may include, for example, different materials. In another implementation, the first and second stress control layers 183A and 183B may include an identical material. According to an example embodiment, the first and second stress control layers 183A and 183B may include any one of, for example, Si, SiN, SiGe, SiON, or SiO.

According to an example embodiment, one of the first and second stress control layers 183A and 183B may be omitted. In this case, one of the first and second fillers 182A and 182B may completely fill the inner spaces defined by the first and second liners 181A and 181B, respectively.

Referring to FIG. 4, first and second isolation layers 180A''' and 180''' may be lower than the first and second external spacers 130A and 130B. Upper surfaces of the first and second isolation layers 180A''' and 180B''' may be lower than upper surfaces of the first and second source/drain regions 150A and 150B. Dielectric constant control layers 171A and 171B may be on the first and second isolation layers 180A''' and 180B''', respectively. Therefore, resistive-capacitive (RC) delay due to a parasitic capacitance may be reduced or prevented by forming the dielectric constant control layers 171A and 171B adjacent to the first and second gate electrodes 190A and 190B with a low-k dielectric material.

Referring to FIG. 4, lower surfaces of the first and second external spacers 130A and 130B may be flush with upper surfaces of the first and second isolation layers 180A''' and 180B''', respectively. In another implementation, the lower surfaces of the first and second external spacers 130A and 130B may be lower or higher than the upper surfaces of the first and second isolation layers 180A 180A''' and 180B', respectively.

FIGS. 5A to 16 are example views of a method of manufacturing the semiconductor device 100.

Figure 5A:
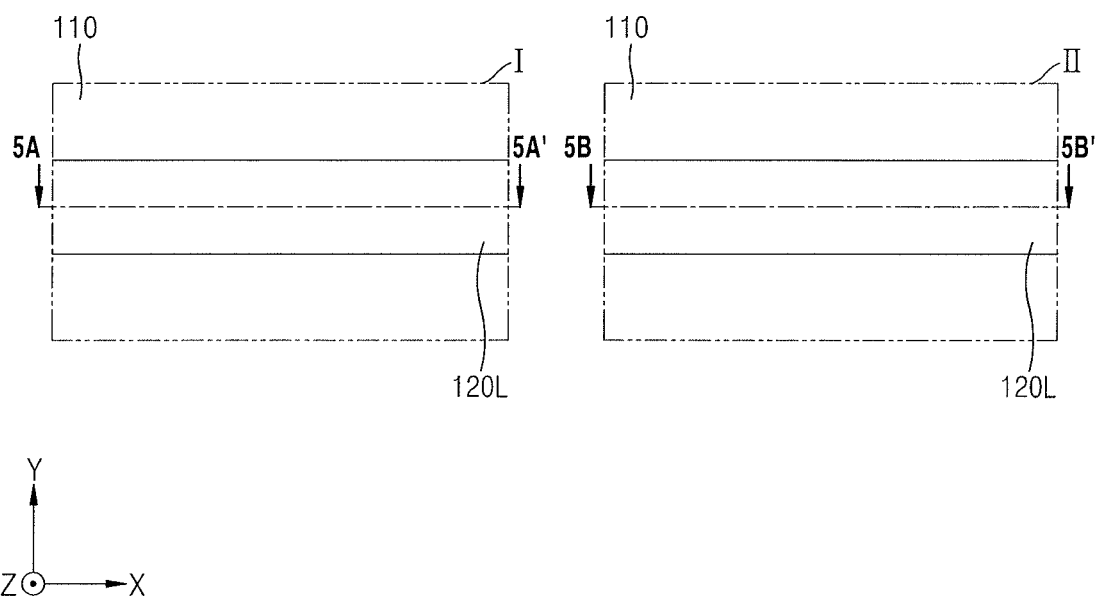
FIGS. 5A to 16 illustrate views of semiconductor devices according to an example embodiment.
Figure 5B:
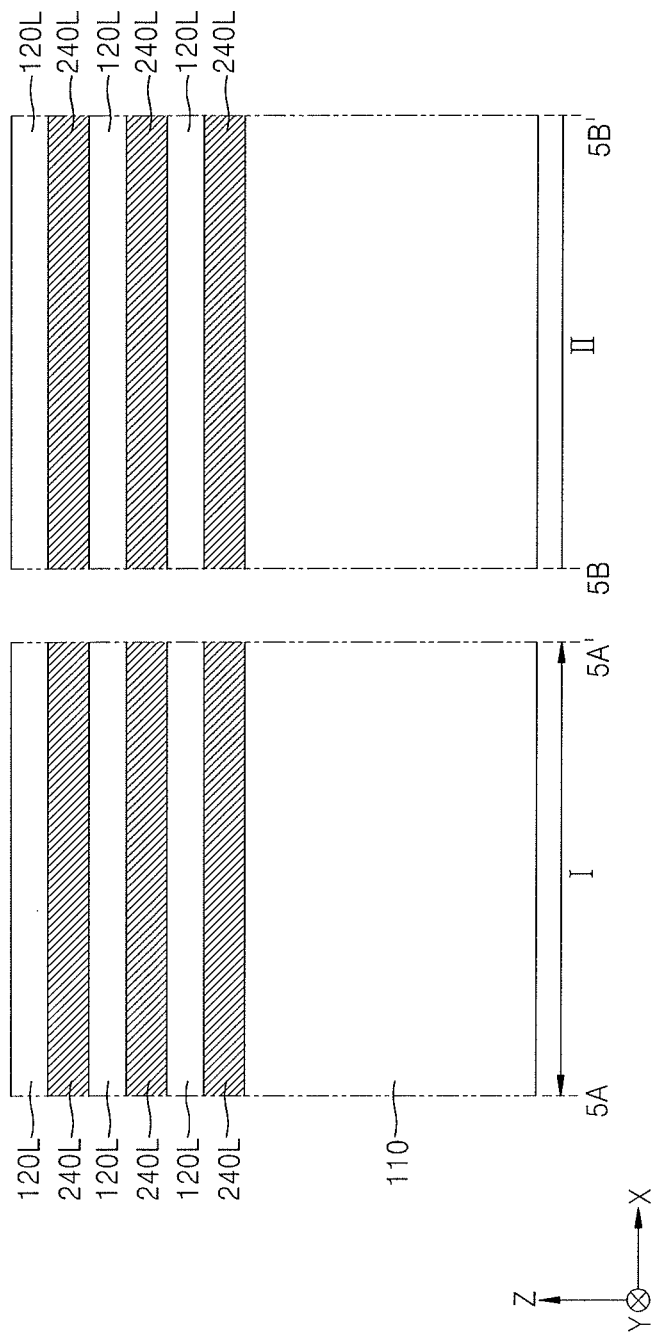
Figure 6A:
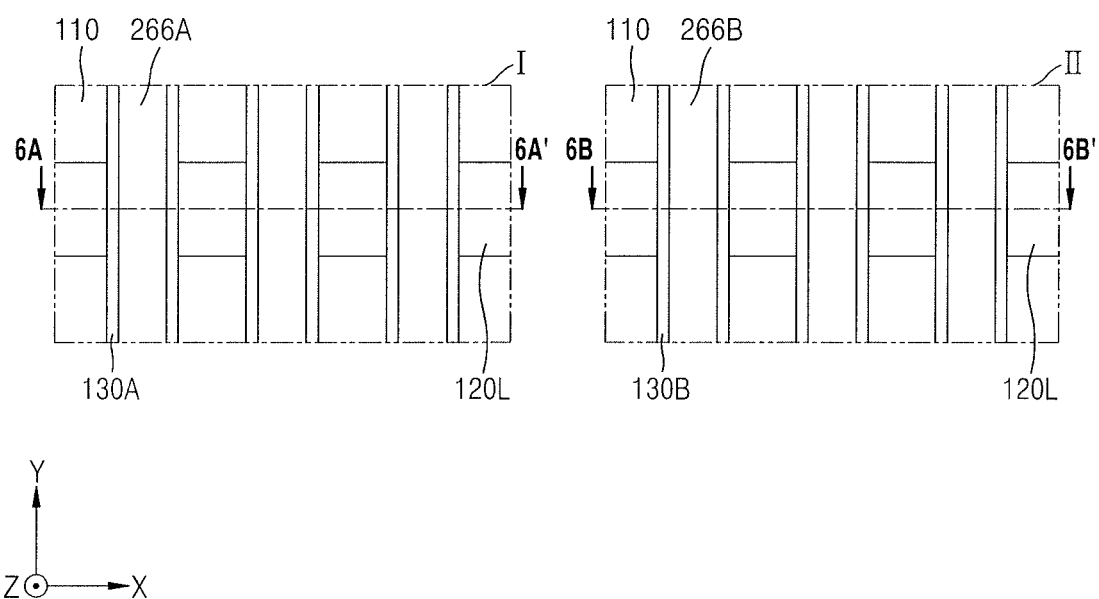
Figure 6B:
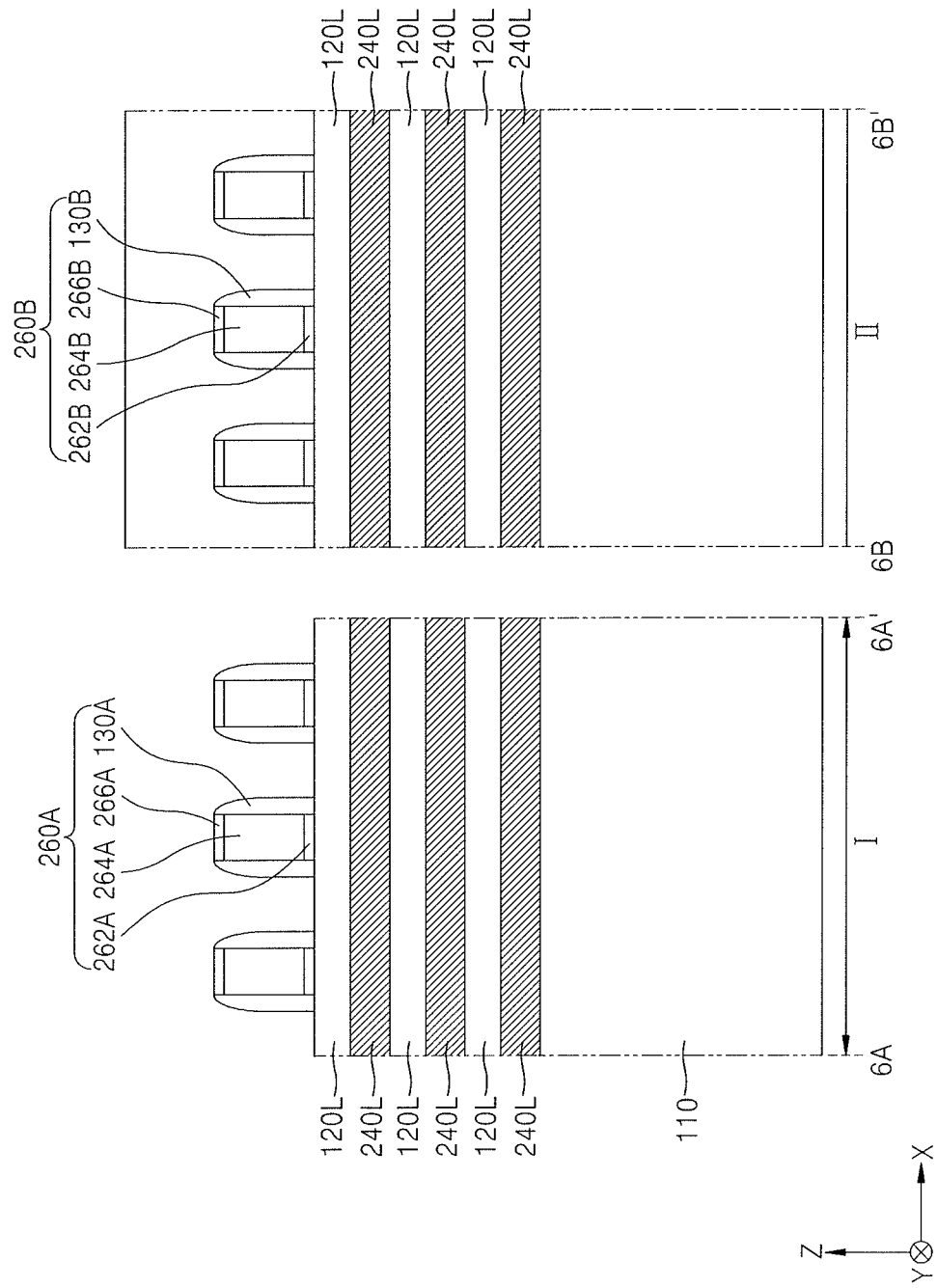
Figure 7A:
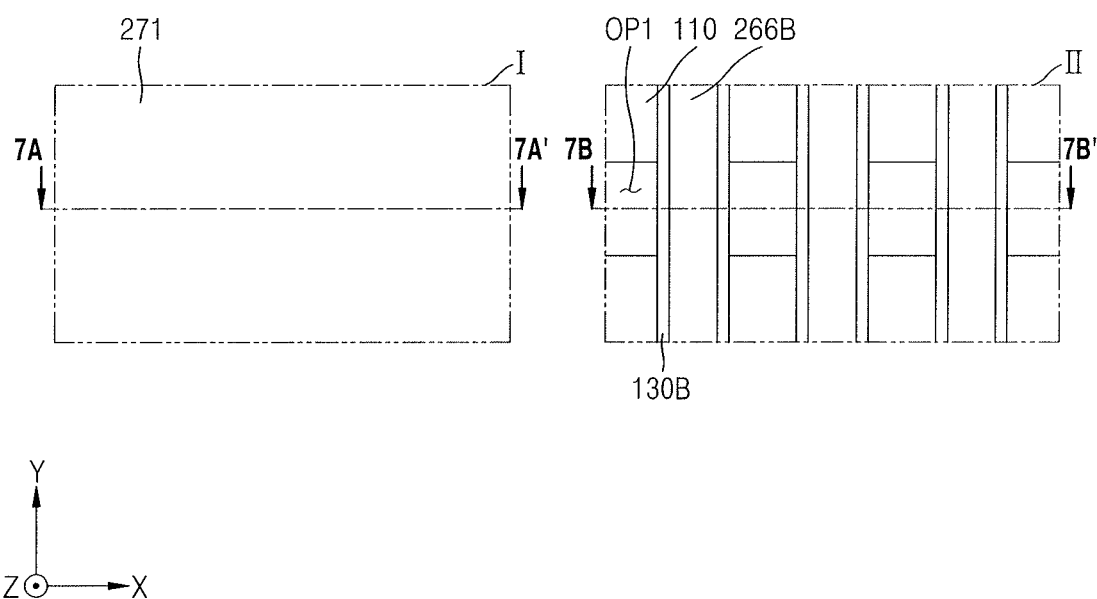
Figure 7B:
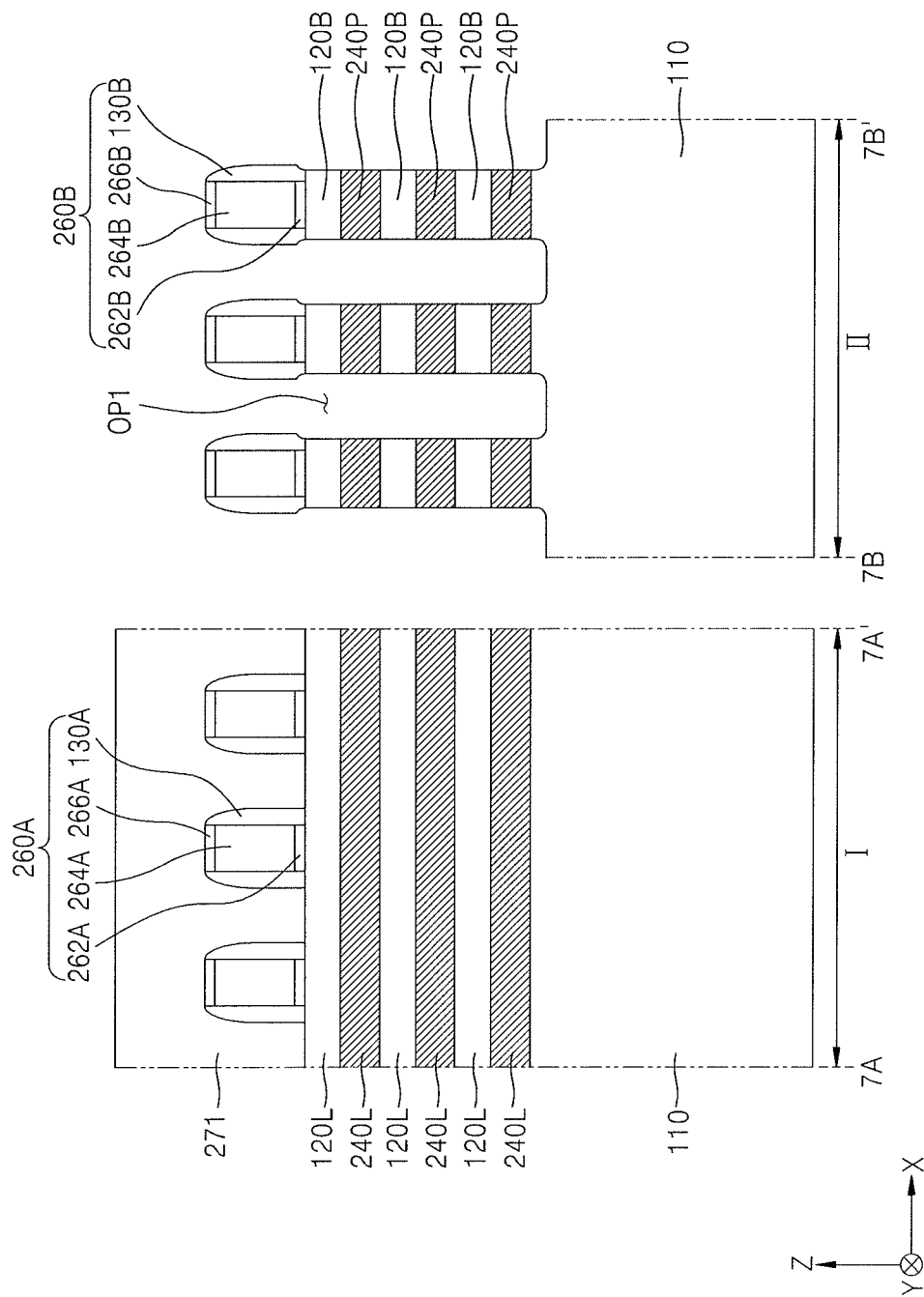
Figure 8A:
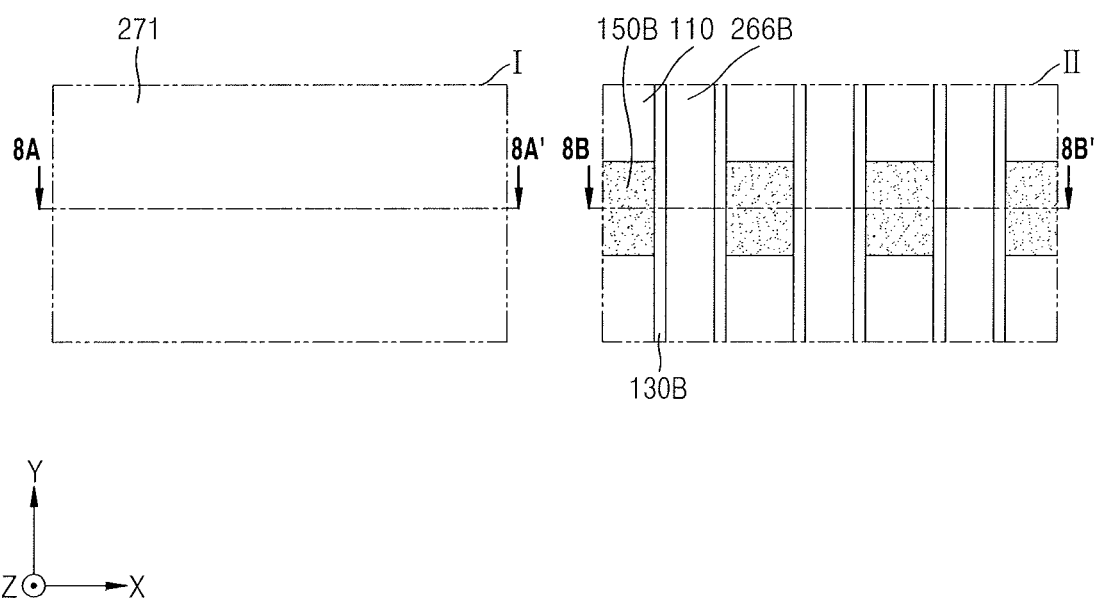
Figure 8B:
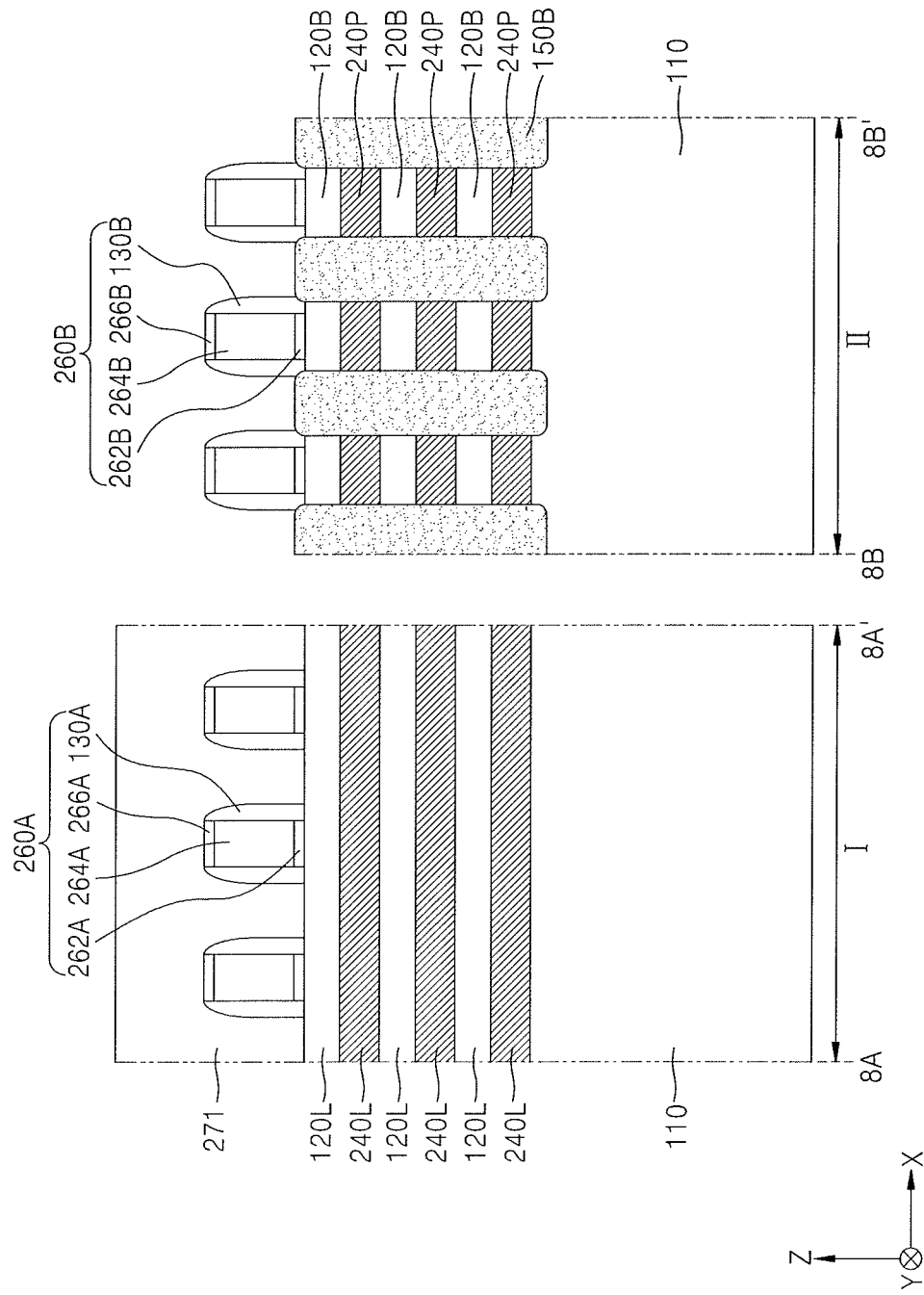
Figure 9A:
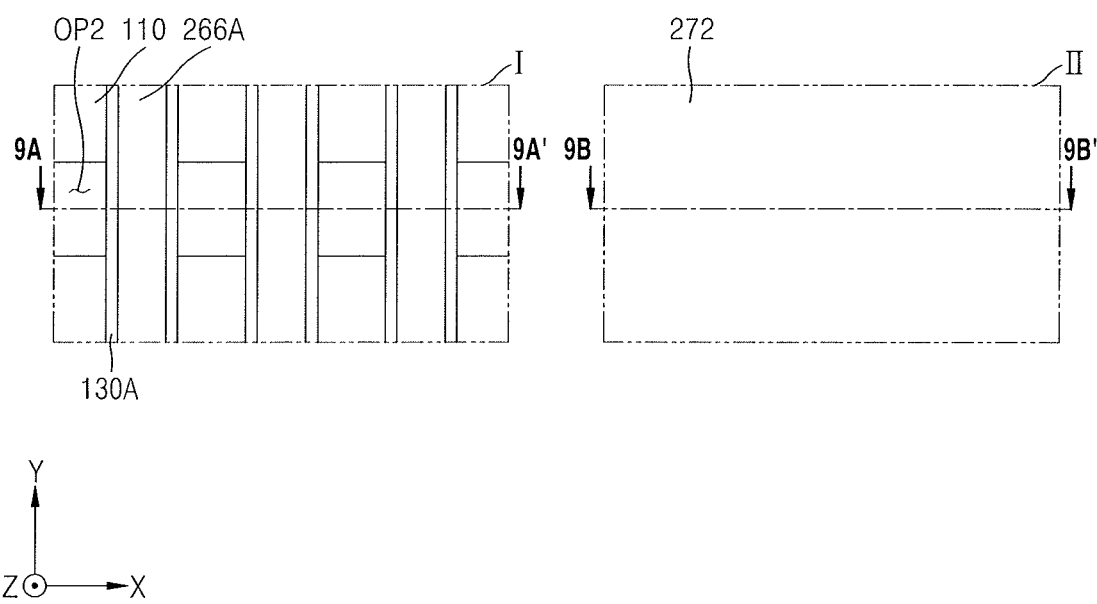
Figure 11A:
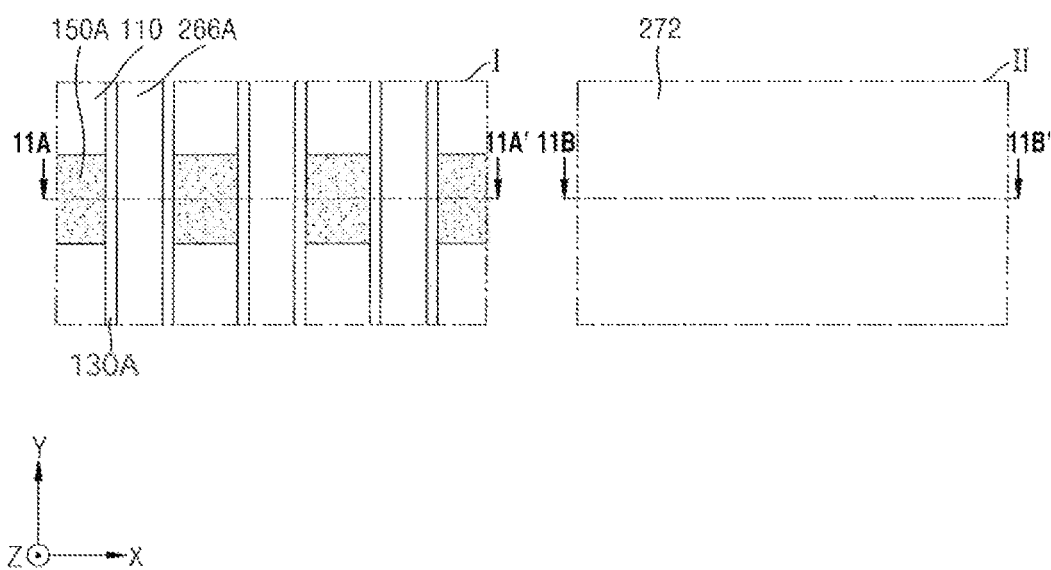
Figure 13A:
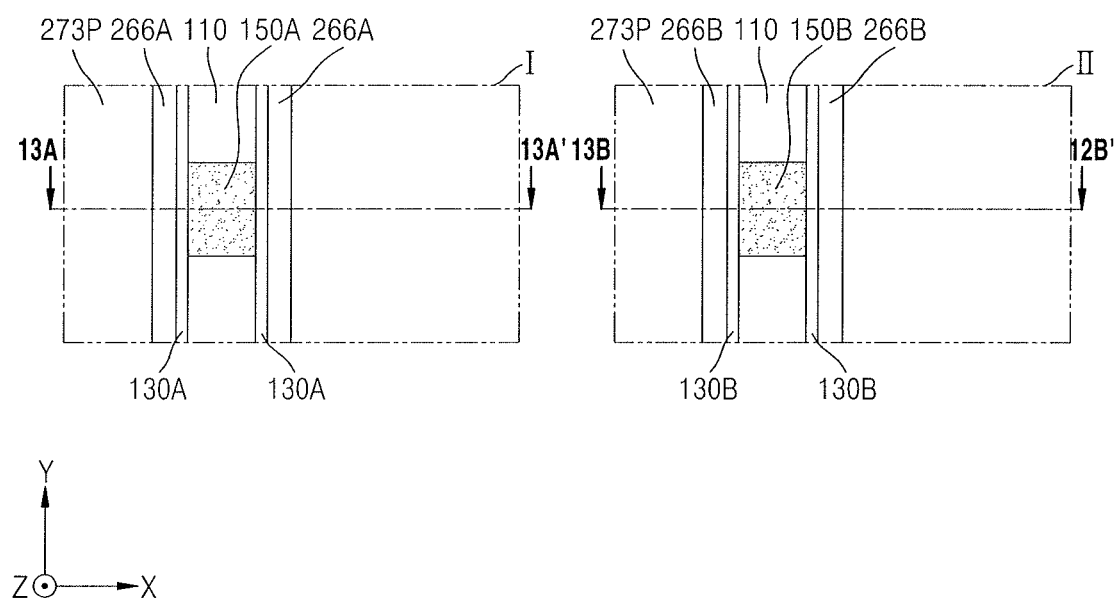
Figure 13B:
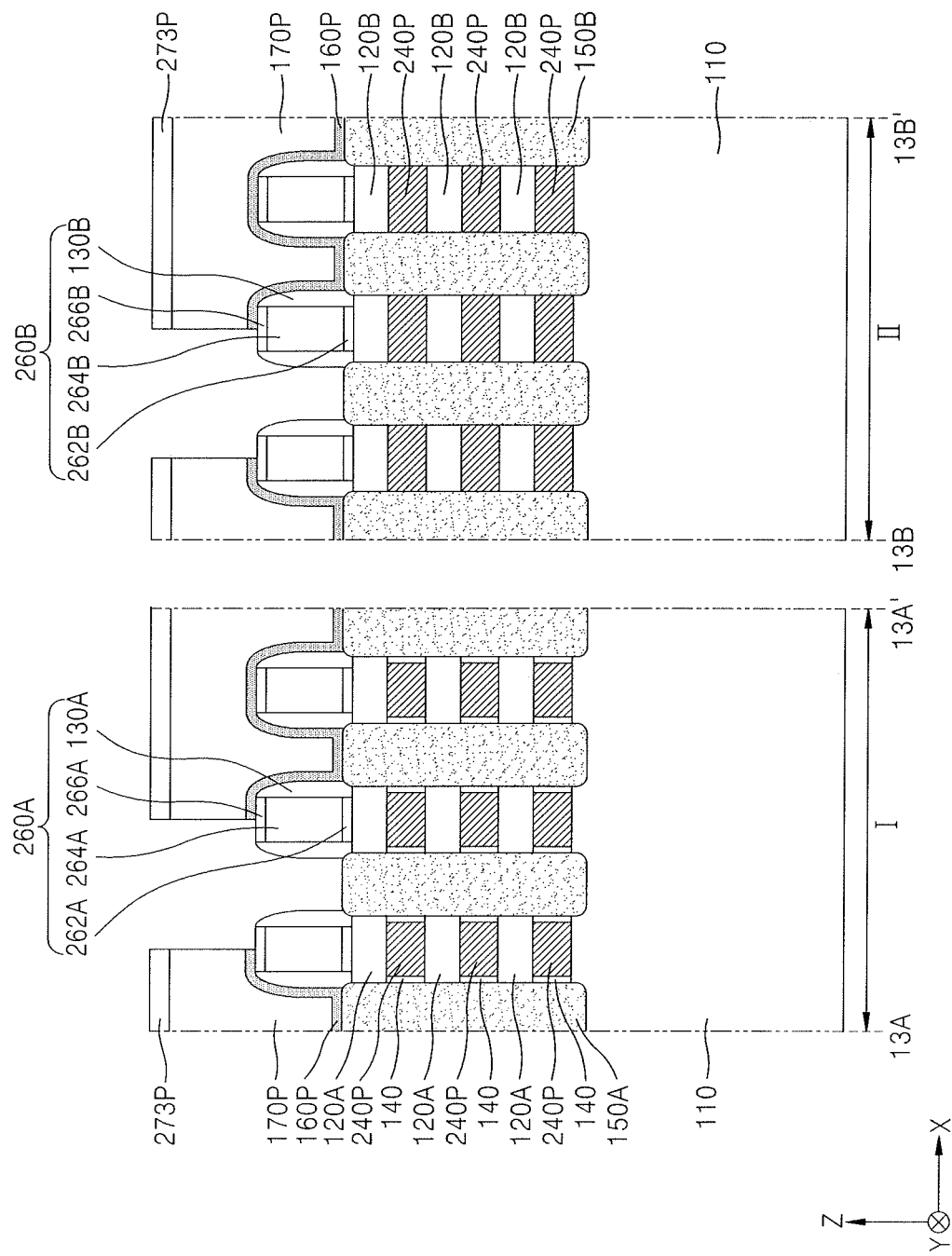
Figure 14A:
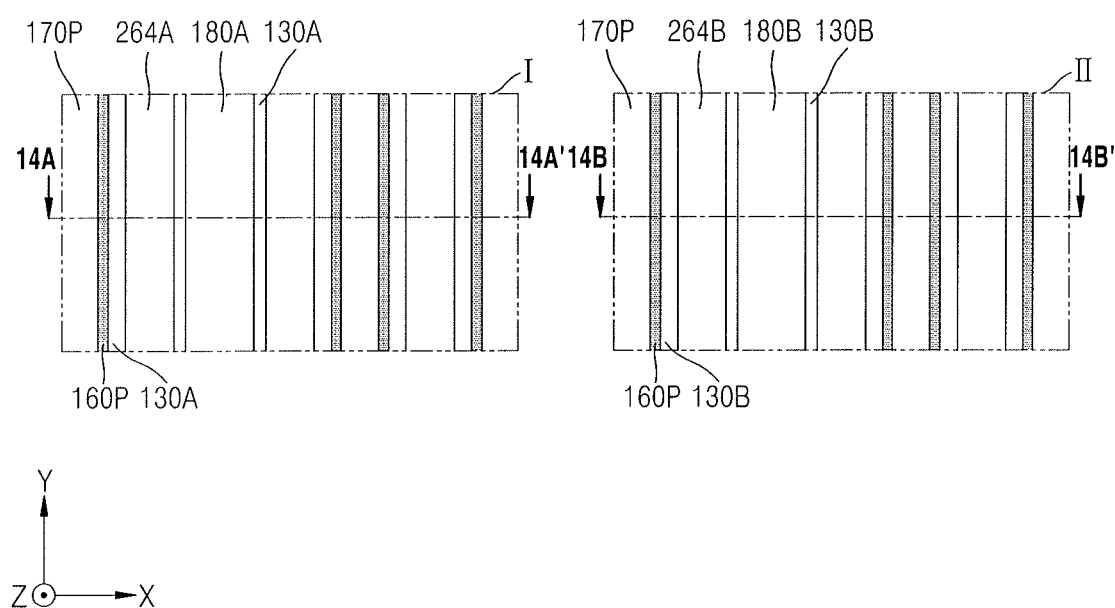

In more detail, FIG. 5A, FIG. 6A, FIG. 7A, FIG. 8A, FIG. 9A, FIG. 11A, FIG. 13A, and FIG. 14A are top views shown in a process sequence, and FIG. 5B, FIG. 6B, FIG. 7B, FIG. 8B, FIG. 9B, FIG. 11B, FIG. 13B, and FIG. 14B are sectional views taken along lines 5A-5A' and 5B-5B' of FIG. 5A, lines 6A-6A' and 6B-6B' of FIG. 6A, lines 7A-7A' and 7B-7B' of FIG. 7A, lines 8A-8A' and 8B-8B' of FIG. 8A, lines 9A-9A' and 9B-9B' of FIG. 9A, lines 11A-11A' and 11B-11B' of FIG. 11A, lines 13A-13A' and 13B-13B' of FIG. 13A, and lines 14A-14A' and 14B-14B' of FIG. 14A, respectively.

Referring to FIGS. 5A and 5B, in an example embodiment at least one sacrificial material layer and a channel material layer are alternately stacked on the substrate 110 on which the first region I and the second region II are defined, and then some of them are etched to form a sacrificial layer 240L and a channel layer 120L. According to an example embodiment, the sacrificial layer 240L and the channel layer 120L may be formed by an epitaxy process. According to an example embodiment, the sacrificial layer 240L and the channel layer 120L may have a certain width in the second direction (Y direction) and extend in the first direction (X direction). The sacrificial layer 240L and the channel layer 120L may be etched to have a fin shape, and a portion where the sacrificial layer 240L and the channel layer 120L are removed by etching may be an exposed portion of the upper surface of the substrate 110.

According to an example embodiment, the sacrificial layer 240L and the channel layer 120L may include different materials, respectively. According to an example embodiment, the sacrificial layer 240L and the channel layer 120L may include materials having different etch selectivities, respectively. According to an example embodiment, each of the sacrificial layer 240L and the channel layer 120L may include a Group IV semiconductor, a Group IV-IV compound semiconductor, or a monocrystalline layer of a Group III-V compound semiconductor. According to an example embodiment, the sacrificial layer 240L may include SiGe, and the channel layer 120L may include monocrystalline silicon.

According to an example embodiment, the epitaxy process may be a chemical vapor deposition (CVD) process such as vapor-phase epitaxy (VPE), ultra-high vacuum chemical vapor deposition (UHV-CVD), etc., molecular beam epitaxy, or a combination thereof. In the epitaxy process, as a precursor for forming the sacrificial layer 240L and the channel layer 120L, a liquid or gaseous precursor may be used.

Referring to FIGS. 6A and 6B, first and second dummy gate structures 260A and 260B may be formed on the first and second regions I and II, respectively. The first and second dummy gate structures 260A and 260B may have a certain width in the first direction (X direction) and may extend in the second direction (Y direction). The first and second dummy gate structures 260A and 260B may include first and second gate etch stop layers 262A and 262B, first and second dummy gate electrodes 264A and 264B, the first and second external spacers 130A and 130B, and the first and second capping layers 266A, 266B, respectively.

According to an example embodiment, the first and second dummy gate electrodes 264A and 264B may include polysilicon and the first and second capping layers 266A and 266B may include a silicon nitride film. The first and second gate etch stop layers 262A and 262B may include a material having an etch selectivity with the first and second dummy gate electrodes 264A and 264B. According to an example embodiment, the first and second gate etch stop layers 262A and 262B may include at least one film selected from, for example, a thermal oxide, a silicon oxide, and a silicon nitride, and the first and second external spacers 130A and 130B may include silicon oxide, silicon oxynitride, or silicon nitride.

Referring to FIGS. 7A and 7B, a first protective layer 271 covering the first dummy gate structure 260A and the channel layer 120L may be formed on the first region I. Next, channel layers 120L (see FIG. 6B) and sacrificial layers 240L (see FIG. 6B) may be etched to form a first opening OP1 using the second dummy gate structure 260B on the second region II as an etching mask. Accordingly, the second nanowires 120B and sacrificial patterns 240P may be formed on the second region II.

According to an example embodiment, a lower surface of the first opening OP1 may be lower than the sacrificial patterns 240P of a lowermost layer. According to an example embodiment, the first opening OP1 may expose a portion of the substrate 110.

Referring to FIGS. 7A to 8B, the second source/drain region 150B filling the first opening OP1 may be formed by growing a monocrystalline film from the substrate 110, the plurality of second nanowires 120B, and the sacrificial patterns 240P in the first opening OP1.

Each of the substrate 110, the plurality of second nanowires 120B, and the sacrificial patterns 240P, which are exposed at a sidewall of the first opening OP1, may be a monocrystalline semiconductor layer. Thus, in a growth process of the second source/drain region 150B, generation of dislocation or stacking faults by lattice mismatch may be avoided, and the second source/drain region 150B may be formed with excellent crystal quality.

FIGS. 8A and 8B show that the second source/drain region 150B is formed as a single layer. In an implementation, the second source/drain region 150B may be formed to include a plurality of layers. For example, the second source/drain region 150B may have a multi-layer structure including SiGe in which the content of Si and Ge is different for each layer. After forming the second source/drain region 150B, the first protective layer 271 may be removed.

Figure 9B:
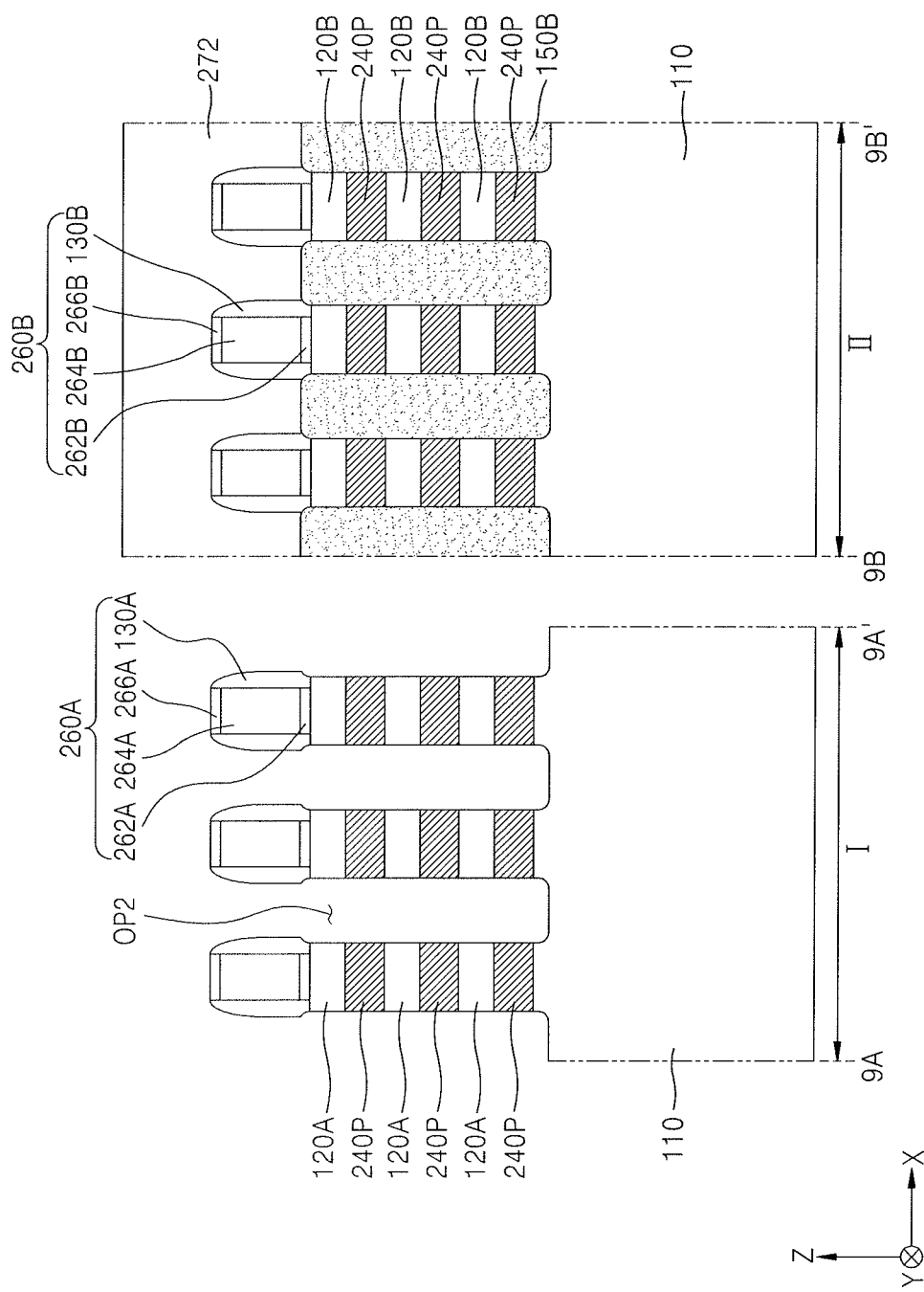

Referring to FIGS. 9A and 9B, a second protective layer 272 may be formed on the second region II. Next, the channel layers 120L (see FIG. 8B) and the sacrificial layers 240L (see FIG. 8B) on the first region I may be etched to form a second opening OP2 using the first dummy gate structure 260A on the first region I as an etching mask. Accordingly, the first nanowires 120A and the sacrificial patterns 240P may be formed on the first region I. The second opening OP2 may expose a portion of the upper surface of the substrate 110.

Figure 10:
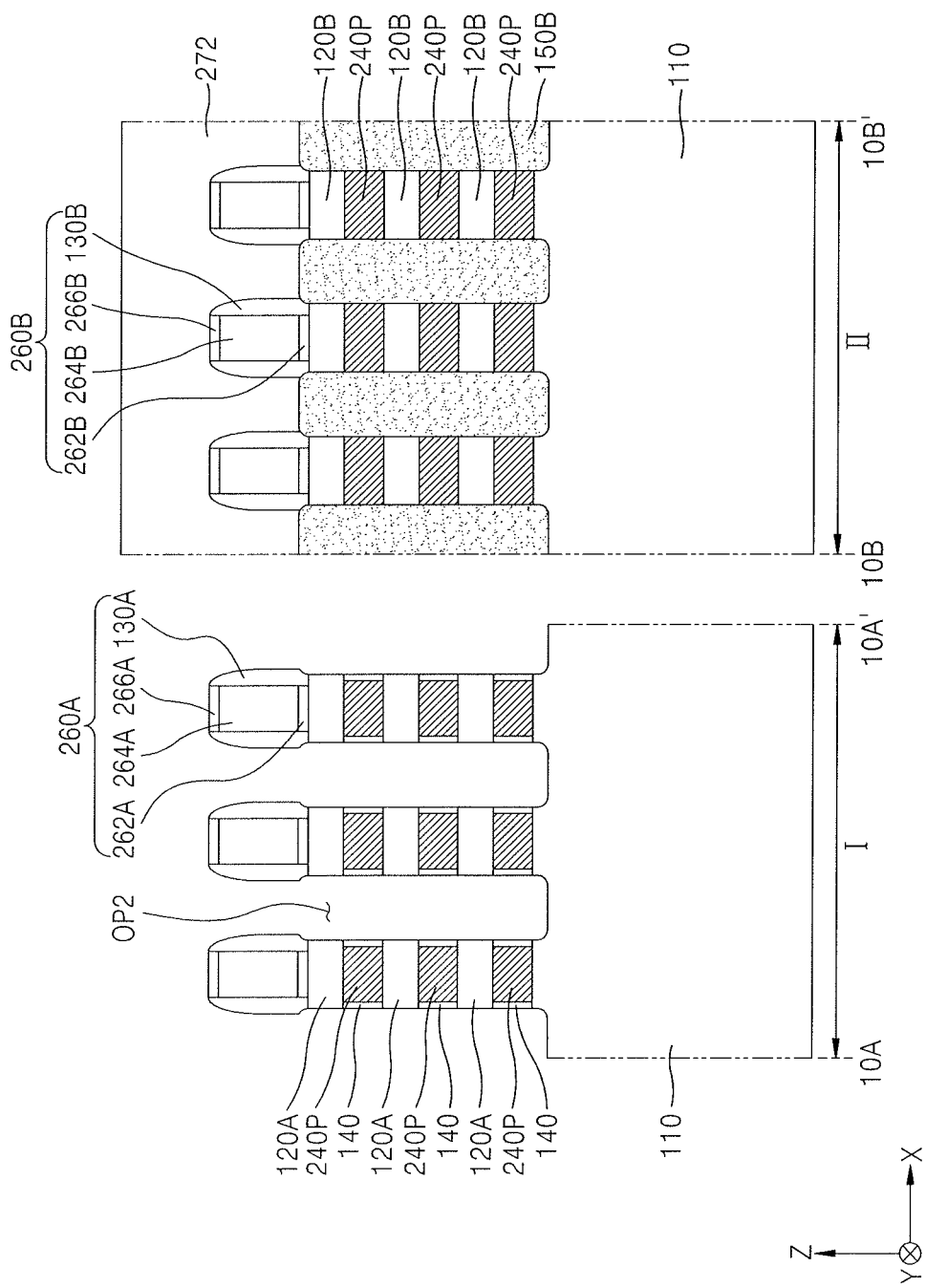

Referring to FIG. 10, after the sacrificial layer 240L exposed by the second opening OP2 is etched to be laterally recessed, an internal spacer material film may be deposited conformally, and the internal spacer 140 may be formed by performing an etch-back process again.

Figure 11B:
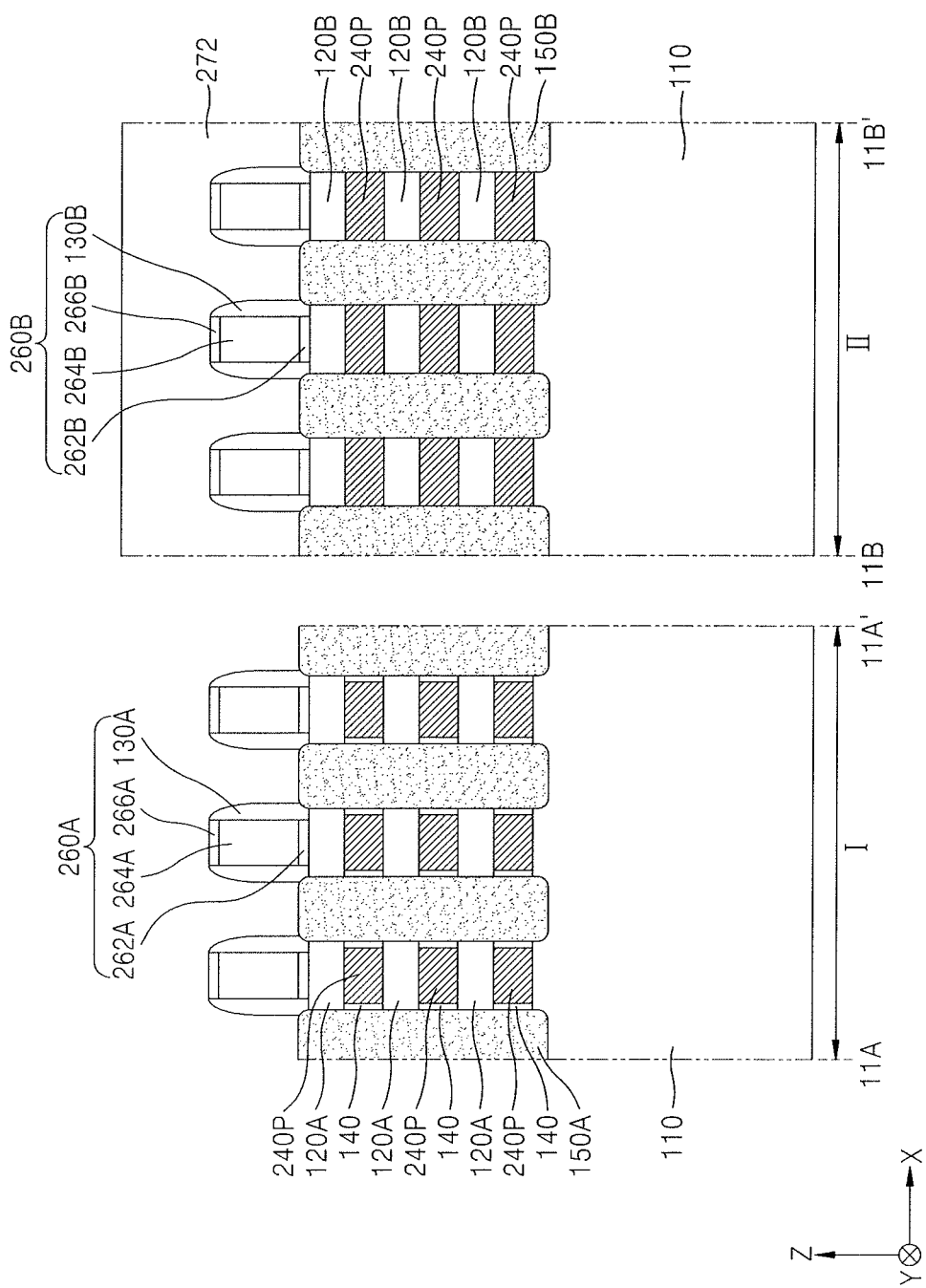

Next, referring to FIGS. 11A and 11B, the first source/drain region 150A may be formed on the first region I in the same manner as described with reference to FIGS. 8A and 8B. The second protective layer 272 may then be removed.

Figure 12:
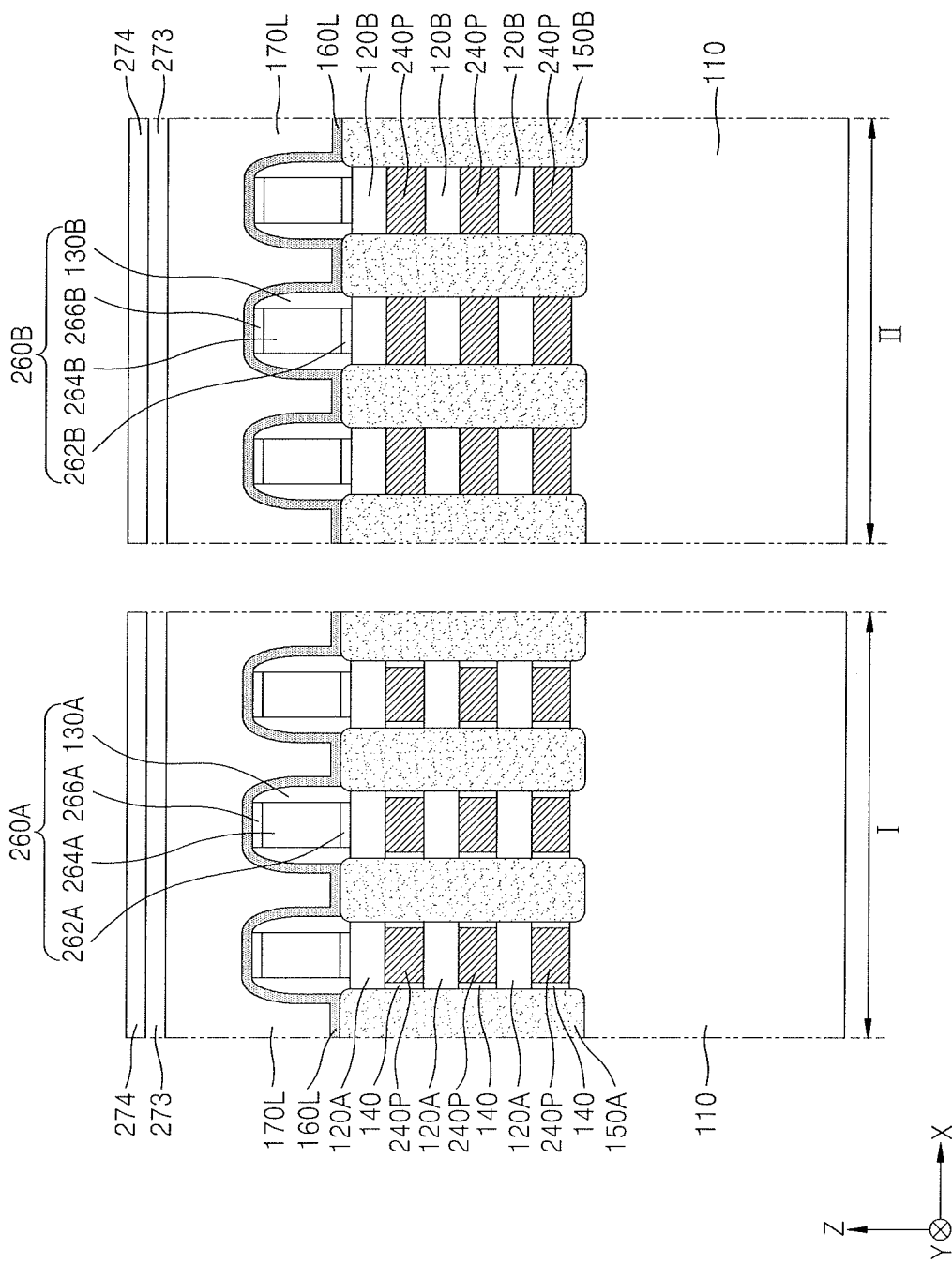

Referring to FIG. 12, an etch stop material film 160L, an insulating material film 170L, a hard mask film 273, and a photoresist 274 may be formed on a resultant structure formed to this point. The etch stop material film 160L may be formed in a conformal manner and may identify an end point of etching in a subsequent process and protect an underlying layer.

According to an example embodiment, the etch stop material film 160L may include a material having a high etch selectivity to the insulating material film 170L. According to an example embodiment, the etch stop material film 160L may include, for example, a silicon nitride.

The insulating material film 170L may be etched to a certain height by a planarization/etch-back process or the like such that no step is formed on an upper surface of the insulating material film 170L. The insulating material film 170L may include a silicon oxide such as Tonen SilaZene (TOSZ).

Referring to FIGS. 12 to 13B, a hard mask pattern 273P may be formed by patterning the hard mask film 273 using a photoresist as an etching mask. The hard mask pattern 273P thus exposes the upper surface of the insulating material film 170L and may have an opening extending in the second direction (Y direction). The insulating material film 170L may be etched so that an upper surface of the etch stop material film 160L is exposed by using the hard mask pattern 273P again as an etch mask. The etch stop material film 160L may be over-etched to expose an upper surface of a portion of the first and second source/drain regions 150A and 150B. Accordingly, an etch stop pattern 160P and an insulating pattern 170P may be formed.

Figure 14B:
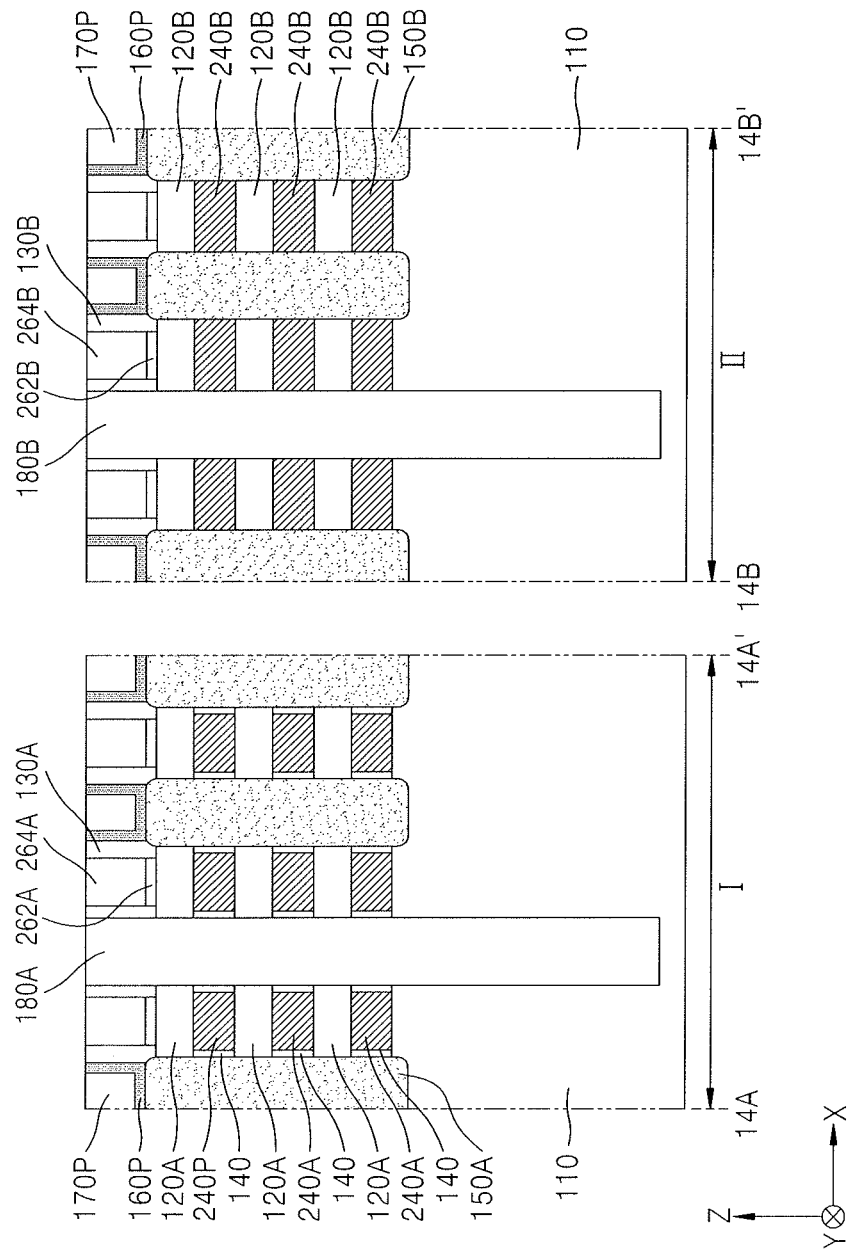

Referring to FIGS. 14A and 14B, the first and second isolation layers 180A and 180B may be formed. The exposed first and second source/drain regions 150A and 150B and the substrate 110 below the first and second source/drain regions 150A and 150B may be etched by using the hard mask pattern 273P as an etching mask to form the first and second isolation layers 180A and 180B. The exposed first and second source/drain regions 150A and 150B may be etched and removed. For example, the portion of the first and second source/drain regions 150A and 150B may remain on side surfaces of the first and second isolation layers 180A and 180B.

The first and second external spacers 130A and 130B exposed by the hard mask pattern 273P may be partially etched by an etching process. Accordingly, a width of the first and second external spacers 130A and 130B exposed by the hard mask pattern 273P may be less (i.e., a length in the first direction (X direction)) than the first and second external spacers 130A and 130B that are not exposed by the hard mask pattern 273P.

Referring to FIG. 1B, the first width IWA and the second width IWB (which are widths of the first and second isolation layers 180A and 180B) may be determined depending on the extent to which the first and second external spacers 130A and 130E in contact with the first and second isolation layers 180A and 180B are etched. For example, when the first external spacers 130A in contact with the first isolation layer 180A are etched to have a smaller width than the second external spacers 130B in contact with the second isolation layer 180B, the first width IWA may be greater than the second width IWB. As another example, when the first external spacers 130A in contact with the first isolation layer 180A are etched to have a greater width than the second external spacers 130E in contact with the second isolation layer 180B, the first width IWA may be less than the second width IWB.

In general, nanowires adjacent to an isolation layer included in a semiconductor device may be arranged adjacent to a boundary between the isolation layer and an active area, and may be vulnerable to a process for forming a gate electrode described below. According to an example embodiment, the first and second capping layers 266A and 266B (see FIG. 13B) and the first and second external spacers 130A and 130B (see FIG. 13B) exposed by the hard mask pattern 273P may together serve as an etch mask. Accordingly, despite the tolerance of an etching process for forming a shallow trench, the first and second isolation layers 180A and 180B may be aligned to be between the first and second external spacers 130A and 130B. Furthermore, a portion of the side surfaces of the first and second isolation layers 180A and 180B may be in contact with the first and second external spacers 130A and 130B. Accordingly, it may be possible to reduce or prevent a short-circuit failure between the first and second source/drain regions 150A and 150B and the first and second gate electrodes 190A and 190B (see FIG. 16) due to damage of the first and second nanowires 120A and 120B during the process for forming a gate electrode described below.

Next, after an isolation material film is sufficiently provided in a trench formed by etching, an upper portion of the isolation material film and the insulating pattern 170P may be removed until upper surfaces of the first and second dummy gate electrodes 264A and 264B are exposed. Thus, the first and second isolation layers 180A and 180B may be formed. Although FIGS. 14A and 14B show that the first and second isolation layers 180A and 180B are formed together, after forming any one of the first and second isolation layers 180A and 180B by forming a protective layer on any one of the first region I and the second region II, the protective layer may be removed to form another one of the first and second isolation layers 180A and 180B. Accordingly, the first and second isolation layers 180A and 180B may include different materials.

In addition, a liner material film may be provided prior to providing the isolation material film so that the first and second isolation layers 180A' and 1803 may be formed in such a manner that the conformal liner 181A covers side and bottom surfaces of the first filler 182A as shown in FIG. 2. In this case, the first and second isolation layers 180A' and 180B' may be formed by, for example, an atomic layer deposition (ALD) process. In another implementation, the first and second isolation layers 180A" and 180B" of FIG. 3 may be provided by sequentially providing the liner material film, the isolation material film, and first and second stress control material films. In this case, the first and second isolation layers 180A" and 180B" may be formed by the ALD process. In some cases, the dielectric constant control layers 171A and 171B of FIG. 4 may be formed by partially removing upper portions of the first and second isolation layers 180A and 180B and then filling the recessed space with a dielectric material.

In general, when forming a source/drain region, a portion of a previously formed isolation layer may be damaged and unintentional epitaxial growth may occur near the damaged isolation layer. According to an example embodiment, the unintentional epitaxial growth may be prevented by forming a portion of the isolation layer after forming the source/drain region.

Figure 15:
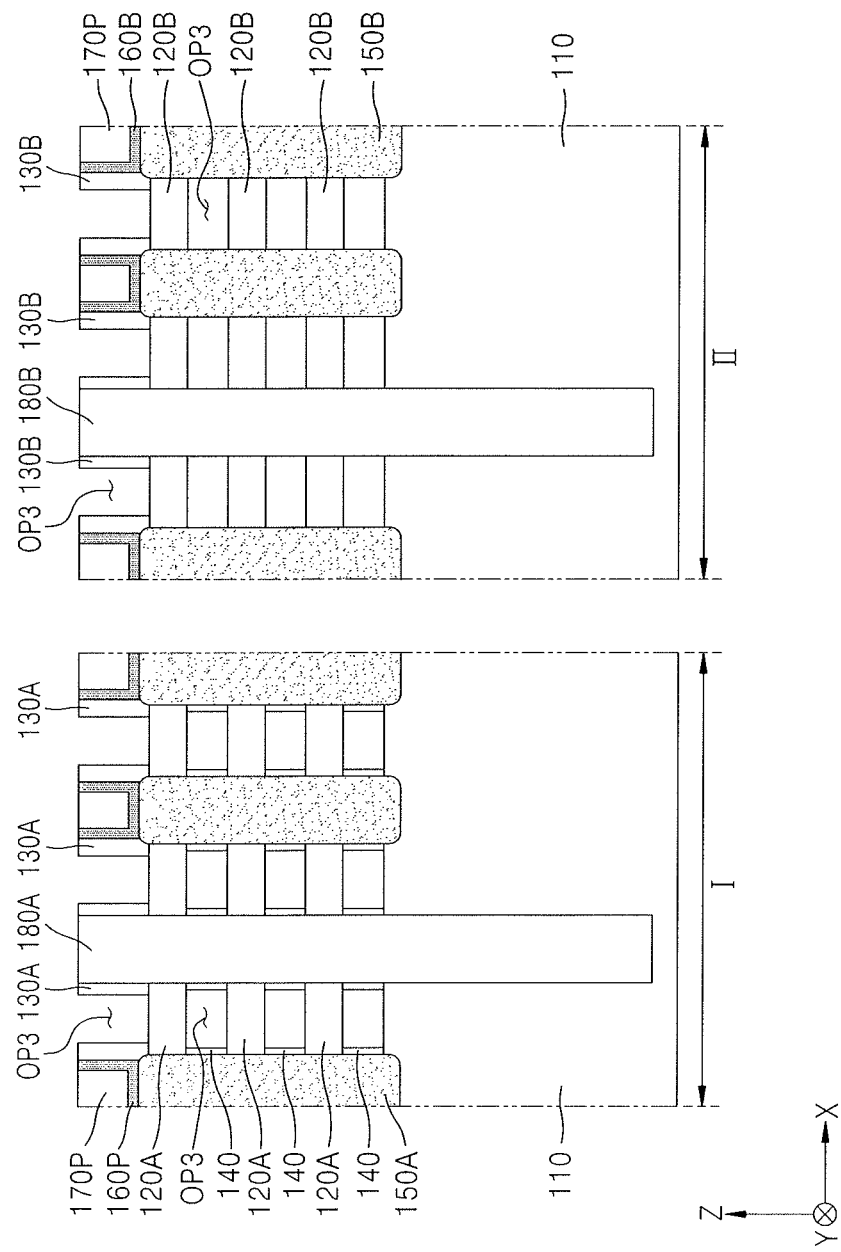

Referring to FIG. 15, the exposed first and second dummy gate structures 260A and 260B and the first and second gate etch stop layers 262A and 262B may be removed to form a third opening OP3. The first and second nanowires 120A and 120B may be exposed through the third opening OP3. A portion of the sacrificial patterns 240P exposed through the third opening OP3 may be selectively removed to extend the third opening OP3 to the upper surface of the substrate 110.

Figure 16:
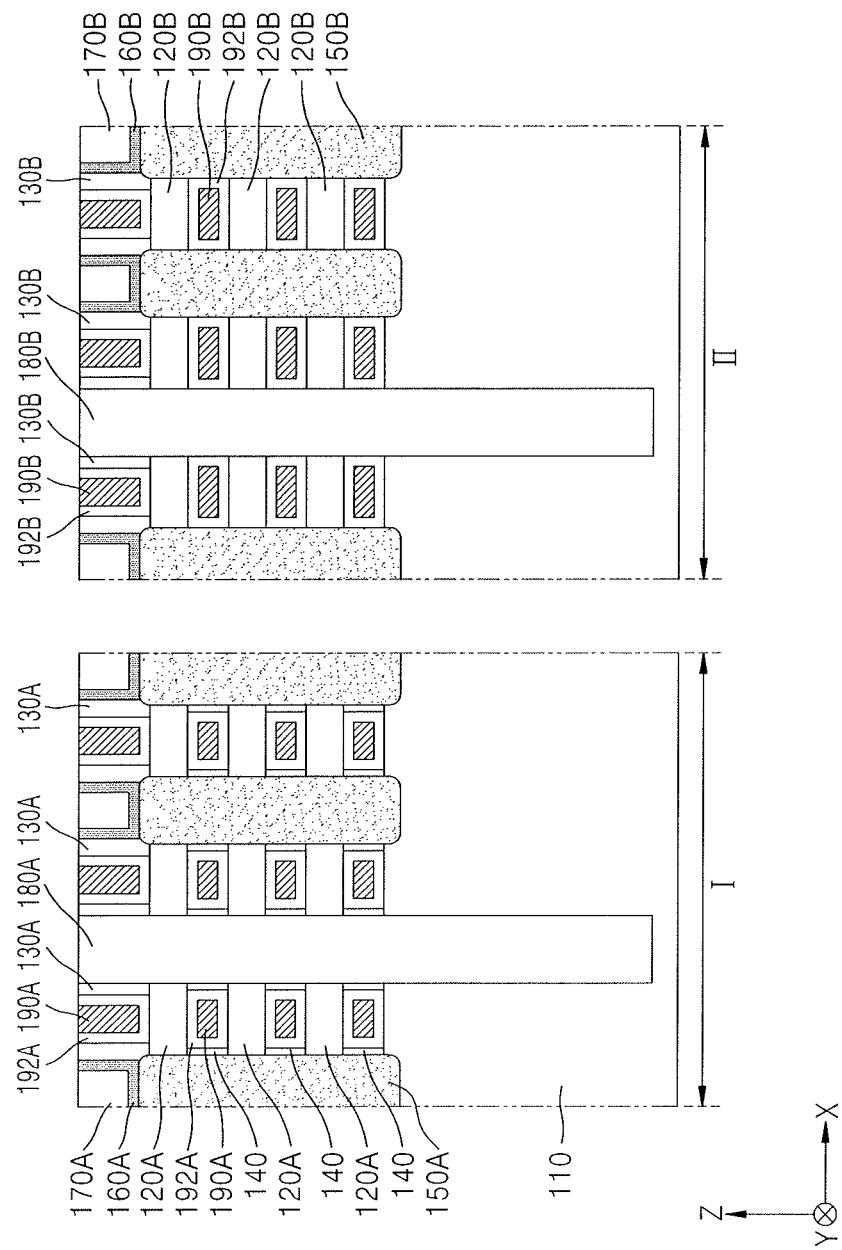

Referring to FIGS. 15 and 16, first and second gate dielectric layers 192A and 192B may be conformally formed on a surface of the first and second regions I and II exposed by the third opening OP3, and the first and second gate electrodes 190A and 190B filling a remaining space of the third opening OP3 may be formed on the first and second gate dielectric layers 192A and 192B, respectively.

Referring to FIGS. 1B and 16, the first and second source/drain contacts 155A and 155B, which penetrate through the etch stop pattern 160P and the insulating pattern 170P and are connected to the first and second source/drain regions 150A and 150B, may be formed in the first and second regions I and II, respectively. Accordingly, the first and second etch stop patterns 160A and 160B and the first and second insulating layers 170A and 170B may be formed.

By way of summation and review, a short channel effect of a transistor may occur due to downscaling of the semiconductor devices, which may lower reliability of the semiconductor devices. In order to reduce the short channel effect, a semiconductor device having a multi-gate structure such as a gate all-around type may be considered.

As described above, embodiments relate to semiconductor devices including a multi-gate metal-oxide-semiconductor field-effect transistor (MOSFET), and methods of manufacturing the same. Embodiments may provide a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate extending in first and second directions intersecting with each other;
    an isolation layer extending in the first direction, the isolation layer having gate electrodes on opposite sides thereof;
    nanowires on the substrate and spaced apart from each other in the second direction;
    a gate dielectric layer between the nanowires and the gate electrodes;
    a source/drain region spaced apart from the isolation layer with the nanowires interposed therebetween;
    a source/drain contact extending in a third direction perpendicular to an upper surface of the substrate and in contact with the source/drain region; and
    external spacers on the substrate, wherein:
    the gate electrodes extend in the first direction and are spaced apart from each other in the second direction, and surround the nanowires so that the gate electrodes are superimposed vertically with the nanowires,
    the external spacers cover sidewalls of the gate electrodes on the nanowires,
    the external spacers contact the isolation layer and the gate dielectric layer on the nanowires, and
    an upper surface of the isolation layer is flush with upper surfaces of the gate electrodes.

2. The semiconductor device as claimed in claim 1, wherein the upper surface of the isolation layer is higher than the nanowires.

3. The semiconductor device as claimed in claim 1, wherein source/drain regions are spaced apart from the isolation layer with the gate electrodes therebetween, wherein a length of the source/drain regions in the third direction is less than a length of the isolation layer in the third direction.

4. The semiconductor device as claimed in claim 3, wherein a lower surface of the isolation layer is lower than lower surfaces of the source/drain regions, and the upper surface of the isolation layer is higher than upper surfaces of the source/drain regions.

5. The semiconductor device as claimed in claim 4, further comprising:
    an etch stop pattern in contact with the upper surfaces of the source/drain regions and side surfaces of the external spacers,
    wherein an upper surface of the etch stop pattern is flush with the upper surface of the isolation layer.

6. The semiconductor device as claimed in claim 3, wherein the external spacers on a cross section parallel to the second and third directions and passing through the source/drain regions are higher than upper surfaces of the source/drain regions.

7. The semiconductor device as claimed in claim 1, wherein some of the external spacers are in contact with the isolation layer.

8. The semiconductor device as claimed in claim 7, wherein a width of the external spacers in contact with the isolation layer in the second direction is less than a width of the external spacers spaced from the isolation layer in the second direction.

9. The semiconductor device as claimed in claim 7, wherein upper surfaces of the external spacers are flush with the isolation layer.

10. The semiconductor device as claimed in claim 1, wherein an upper surface of the gate dielectric layer is flush with the upper surface of the isolation layer.

11. A semiconductor device, comprising:
    a substrate extending in first and second directions intersecting with each other;
    nanowires on the substrate and spaced apart from each other in the second direction;
    an isolation layer between gate electrodes and extending in the first direction, the gate electrodes extending in the first direction and being spaced apart from each other in the second direction, and surrounding the nanowires so that the gate electrodes are superimposed vertically with the nanowires;
    a source/drain region spaced apart from the isolation layer with the nanowires interposed therebetween;
    a source/drain contact extending in a third direction perpendicular to an upper surface of the substrate and in contact with the source/drain region; and
    external spacers on the substrate and covering sidewalls of the gate electrodes on the nanowires, wherein:
    the isolation layer includes a plurality of layers, wherein the plurality of layers includes a liner in contact with the nanowires and the external spacers, wherein the liner is conformally formed.

12. The semiconductor device as claimed in claim 11, wherein the plurality of layers of the isolation layer further includes a filler having a different composition than the liner and filling at least a portion of the inside of the liner.

13. The semiconductor device as claimed in claim 12, wherein:
    the filler is conformally formed, and
    the plurality of layers of the isolation layer further includes a stress control layer filling the inside of the filler.

14. The semiconductor device as claimed in claim 13, wherein upper surfaces of the liner, the filler, and the stress control layer form a coplanar surface.

15. A semiconductor device, comprising:
    a substrate including a first region and a second region that are horizontally spaced from each other;
    first nanowires in the first region and horizontally spaced from each other;
    a first isolation layer between first gate electrodes, the first gate electrodes being in the first region and surrounding the first nanowires, an upper surface of the first isolation layer being arranged at a same level as upper surfaces of the first gate electrodes;
    first gate dielectric layers in the first region and between the first nanowires and the first gate electrodes;
    a first source/drain region spaced apart from the first isolation layer with the first nanowires interposed therebetween;
    a first source/drain contact extending in a third direction perpendicular to an upper surface of the substrate and in contact with the first source/drain region;
    first external spacers in contact with the first isolation layer and the first gate dielectric layers on the first nanowires;
    second nanowires in the second region and horizontally spaced from each other;

a second isolation layer between second gate electrodes, the second gate electrodes being in the second region and surrounding the second nanowires, an upper surface of the second isolation layer being arranged at a same level as upper surfaces of the second gate electrodes;

second gate dielectric layers in the second region and between the second nanowires and the second gate electrodes;

a second source/drain region spaced apart from the second isolation layer with the second nanowires interposed therebetween;

a second source/drain contact extending in the third direction and in contact with the second source/drain region; and second external spacers in contact with the second isolation layer and the second gate dielectric layers on the second nanowires.

16. The semiconductor device as claimed in claim 15, wherein a width of the first isolation layer is different from a width of the second isolation layer.

17. The semiconductor device as claimed in claim 15, wherein some of the first external spacers are in contact with the first isolation layer and some of the second external spacers are in contact with the second isolation layer, and widths of the first external spacers in contact with the first isolation layer are different from widths of the second external spacers in contact with the second isolation layer.

18. The semiconductor device as claimed in claim 15, wherein each of the first isolation layer and the second isolation layer includes a plurality of layers.

19. The semiconductor device as claimed in claim 18, wherein the first isolation layer and the second isolation layer include different materials.

20. The semiconductor device as claimed in claim 19, wherein:

the plurality of layers of the first isolation layer includes:
 a first liner conformally formed to have a U-shaped cross-section;
 a first filler on the first liner and conformally formed; and
 a first stress control layer filling an inside of the first filler, the plurality of layers of the second isolation layer includes:
 a second liner conformally formed to have a U-shaped cross-section;
 a second filler on the second liner and conformally formed; and
 a second stress control layer filling the inside of the second filler, and the first stress control layer and the second stress control layer include different materials.

* * * * *